(12) United States Patent
Bhat et al.

(10) Patent No.: US 7,557,013 B2
(45) Date of Patent: Jul. 7, 2009

(54) METHODS OF FORMING A PLURALITY OF CAPACITORS

(75) Inventors: Vishwanath Bhat, Boise, ID (US); Niraj B. Rana, Boise, ID (US); Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 349 days.

(21) Appl. No.: 11/402,018

(22) Filed: Apr. 10, 2006

(65) Prior Publication Data

US 2007/0238259 A1    Oct. 11, 2007

(51) Int. Cl.
H01L 21/20    (2006.01)
H01L 21/8242    (2006.01)
H01L 21/76    (2006.01)

(52) U.S. Cl. .................. 438/396; 438/239; 438/381; 257/532; 257/E29.18; 257/E29.346

(58) Field of Classification Search .............. 438/239, 438/381, 396; 257/532, E29.18, E29.346, 257/E28.18
See application file for complete search history.

(56) References Cited

U.S. PATENT DOCUMENTS

| 4,517,729 | A | 5/1985 | Batra |
| 5,236,860 | A | 8/1993 | Fazan et al. |
| 5,340,763 | A | 8/1994 | Dennison |
| 5,401,681 | A | 3/1995 | Denison |
| 5,467,305 | A | 11/1995 | Bertin et al. |
| 5,498,562 | A | 3/1996 | Dennison et al. |
| 5,532,089 | A | 7/1996 | Adair et al. |
| 5,604,696 | A | 2/1997 | Takaishi |
| 5,605,857 | A | 2/1997 | Jost et al. |
| 5,652,164 | A | 7/1997 | Dennison et al. |

(Continued)

FOREIGN PATENT DOCUMENTS

JP    08274278    10/1996

(Continued)

OTHER PUBLICATIONS

J. Banhart, *Aluminum Foams: On the Road to Real Applications*, Mrs Bulletin, pp. 290-295 (Apr. 2003).

(Continued)

*Primary Examiner*—Julia Slutsker
(74) *Attorney, Agent, or Firm*—Wells St. John P.S.

(57) ABSTRACT

A method of forming a plurality of capacitors includes an insulative material received over a capacitor array area and a circuitry area. The array area comprises a plurality of capacitor electrode openings within the insulative material received over individual capacitor storage node locations. The intervening area comprises a trench. Conductive material is formed within the openings and against a sidewall portion of the trench to less than completely fill the trench. Conductive material received over the trench sidewall portion is covered with a silicon nitride-comprising layer which less than fills remaining trench volume. The insulative material within the array area and the silicon nitride-comprising layer are etched with a liquid etching solution effective to expose outer sidewall portions of the conductive material within the array area and to expose the conductive material within the trench. The conductive material within the array area is incorporated into a plurality of capacitors.

45 Claims, 18 Drawing Sheets

U.S. PATENT DOCUMENTS

| | | |
|---|---|---|
| 5,654,222 A | 8/1997 | Sandhu et al. |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |
| 5,821,140 A | 10/1998 | Jost et al. |
| 5,869,382 A | 2/1999 | Kubota |
| 5,900,660 A | 5/1999 | Jost et al. |
| 5,955,758 A | 9/1999 | Sandhu et al. |
| 5,981,350 A | 11/1999 | Geusic et al. |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,180,450 B1 | 1/2001 | Dennison |
| 6,204,143 B1 | 3/2001 | Roberts et al. |
| 6,204,178 B1 | 3/2001 | Marsh |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,617,222 B1 | 9/2003 | Coursey |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,812,513 B2 | 11/2004 | Geusic et al. |
| 6,822,261 B2 | 11/2004 | Yamazaki et al. |
| 6,844,230 B2 | 1/2005 | Reinberg |
| 6,849,496 B2 | 2/2005 | Jaiprakash et al. |
| 6,897,109 B2 | 5/2005 | Jin et al. |
| 6,830,640 B2 | 8/2005 | Chung et al. |
| 6,927,122 B2 | 8/2005 | Geusic et al. |
| 7,042,040 B2 | 5/2006 | Horiguchi |
| 7,064,028 B2 | 6/2006 | Ito et al. |
| 7,064,365 B2 | 6/2006 | An et al. |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,393,741 B2 | 7/2008 | Sandhu et al. |
| 7,413,952 B2 | 8/2008 | Busch et al. |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhof |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 | 1/2004 | Yu et al. |
| 2004/0056295 A1 | 3/2004 | Agarwal et al. |
| 2004/0110340 A1* | 6/2004 | Kim et al. ............... 438/253 |
| 2004/0150070 A1 | 8/2004 | Okada et al. |
| 2004/0188738 A1 | 9/2004 | Farnworth et al. |
| 2005/0051822 A1 | 3/2005 | Manning |
| 2005/0054159 A1* | 3/2005 | Manning et al. ............ 438/253 |
| 2005/0158949 A1 | 7/2005 | Manning |
| 2005/0287780 A1 | 12/2005 | Manning et al. |
| 2006/0014344 A1* | 1/2006 | Manning ................. 438/243 |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0121672 A1 | 6/2006 | Basceri et al. |
| 2006/0148190 A1 | 7/2006 | Busch |
| 2006/0186451 A1 | 8/2006 | Dusberg et al. |
| 2006/0211211 A1 | 9/2006 | Sandhu et al. |
| 2006/0249798 A1 | 11/2006 | Manning |
| 2006/0261440 A1 | 11/2006 | Manning |
| 2006/0263988 A1 | 11/2006 | Manning |
| 2007/0032014 A1 | 2/2007 | Sandhu et al. |
| 2007/0048976 A1 | 3/2007 | Raghu |
| 2007/0093022 A1 | 4/2007 | Basceri |
| 2007/0099328 A1 | 5/2007 | Chiang et al. |
| 2007/0145009 A1 | 6/2007 | Fucsko et al. |
| 2007/0196978 A1 | 8/2007 | Manning |

FOREIGN PATENT DOCUMENTS

| | | |
|---|---|---|
| JP | 10189912 | 7/1998 |
| JP | 11191615 | 7/1999 |
| JP | 2000196038 | 7/2000 |
| JP | 2003264246 | 9/2003 |
| JP | 2003273247 | 9/2003 |
| JP | 2003297952 | 10/2003 |
| JP | 2004111626 | 4/2004 |
| JP | 2004128463 | 4/2004 |
| KR | 20010061020 | 7/2001 |
| KR | 20010114003 | 12/2001 |
| KR | 1020030058018 | 7/2003 |
| KR | 1020050000896 | 1/2005 |
| WO | PCT/US2004/027898 | 8/2004 |
| WO | PCT/US2004/040252 | 12/2004 |
| WO | WO 2005/024936 | 3/2005 |

OTHER PUBLICATIONS

D. Crouse et al., *Self-Assembled Nanostructures Using Anodized Alumina Thin Films for Optoelectronic Applications*, IEEE, pp. 234-235 (1999).

L. J. Gibson, *Cellular Solids*, Mrs Bulletin, pp. 270-274 (Apr. 2003).

D. J. Green et al., *Cellular Ceramics: Intriguing Structures, Novel Properties, and Innovative Applications*, Mrs Bulletin, pp. 296-300 (Apr. 2003).

D. J. Green et al., *The Structure and Applications of Cellular Ceramics*, Mrs Bulletin, 10 pages (Apr. 2003).

J. M. Karp et al., *Scaffolds for Tissue Engineering*, Mrs Bulletin, pp. 301-302 (Apr. 2003).

D. H. Kim et al., *A Mechanically Enhanced Storage note for virtually unlimited Height (MESH) Capacitor Aiming at sub 70nm DRAMs*, IEEE, pp. 69-72 (2004).

V. V. Konovalov et al., *Chemistry of Materials: Highly Ordered Nanotopographies on Electropolished Aluminum Single Crystals*, Chem. Mater., vol. 11, No. 8, pp. 1949-1951 (1999).

A. Kraynik, *Foam Structure: From Soap Froth to Solid Foams*, Mrs Bulletin, pp. 275-278 (Apr. 2003).

J. Liang et al., *Nonlithographic Fabrication of Lateral Superlattices for Nanometric Electromagnetic-Optic . . .* , IEEE Journal of Selected topics in Quantum Electronics, vol. 8, No. 5, pp. 998-1008 (Sep./Oct. 2002).

C. Y. Liu et al., *Ordered anodic alumina nanochannels on focused-ion-beam-prepatterned aluminum surfaces*, Appl. Phys. Lett., vol. 78, No. 1, pp. 120-122 (Jan. 2001).

E. Maire et al., *In Situ X-Ray Tomography Measurements of Deformation in Cellular Solids*, Mrs Bulletin, pp. 284-289 (Apr. 2003).

H. Masuda et al., *Highly ordered nanochannel-array architecture in anodic alumina*, Appl. Phys. Lett., vol. 71, No. 19, pp. 2270-2772 (Nov. 1997).

A. Nadeem et al., *Fabrication of Microstructures Using Aluminum Anodization Techniques*, pp. 274-277 (pre-2004).

English Abstract:: G. H. Oh et al., *Preparation and Pore-Characteristics Control of Nano-Porous Materials Using Organometallic Building Blocks*, Carbon Science, vol. 4, No. 1, pp. 1-9 (Mar. 2003).

P. R. Onck, *Scale Effects in Cellular Metals*, Mrs Bulletin, pp. 279-283 (Apr. 2003).

J. P. O'Sullivan et al., *The morphology and mechanism of formation of porous anodic films on aluminum*, Proc. Roy. Soc. Lond. A., vol. 317, pp. 511-543 (1970).

J. M. Park et al., *Novel Robust Cell Capacitor (Leaning Exterminated Ring type Insulator) and New Storage Node Contact (Top . . .* , 2004 Symposium on VLSI Technology Digest of Technical Papers, IEEE, pp. 34-35 (2004).

M. Park et al., *Block Copolymer Lithography: Periodic Arrays of ~$10^{11}$ Holes in 1 Square Centimeter*, Science, vol. 276, pp. 1401-1404 (May 1997).

S. Shingubara, *Fabrication of nanomaterials using porous alumina templates*, Journal of Nanoparticle Research, vol. 5, pp. 17-30 (2003).

U.S. Appl. No. 11/006,331, filed Dec. 2004, Basceri et al.
U.S. Appl. No. 11/083,489, filed Mar. 2005, Sandhu et al.
U.S. Appl. No. 11/131,552, filed May 2005, Manning.
U.S. Appl. No. 11/131,575, filed May 2005, Manning.
U.S. Appl. No. 11/196,593, filed Aug. 2005, Sandhu et al.
U.S. Appl. No. 11/272,232, filed Nov. 2005, Manning et al.
U.S. Appl. No. 11/272,247, filed Nov. 2005, Manning et al.

S. Tan et al., *High Aspect Ratio Microstructures on Porous Anodic Aluminum Oxide*, IEEE, pp. 267-272 (1995).

M. Tsukada et al., *Preparation and Application of Porous Silk Fibroin Materials*, Journal of Applied Polymer Science, vol. 54, pp. 507-514 (1994).

U.S. Appl. No. 04/0027898, filed Aug. 26, 2004, Written Opinion.
U.S. Appl. No. 06/06806, filed Mar. 30, 2007, IPER.
U.S. Appl. No. 11/360,540, filed Feb. 2006, Rana.
U.S. Appl. No. 11/580,418, filed Oct. 2006, Raghu et al.

Li, X. and Bohn, P.W., "*Metal-assisted chemical etching in $HF/H_2O_2$ produces porous silicon*", Applied Physics Letters, vol. 77, No. 16, Oct. 16, 2000, pp. 2572-2574.

US06/06806, Jan. 12, 2004, Search Report.
US06/06806, Aug. 26, 2004, Written Opinion.
US06/06806, Aug. 26, 2004, Response to Written Opinion.

* cited by examiner

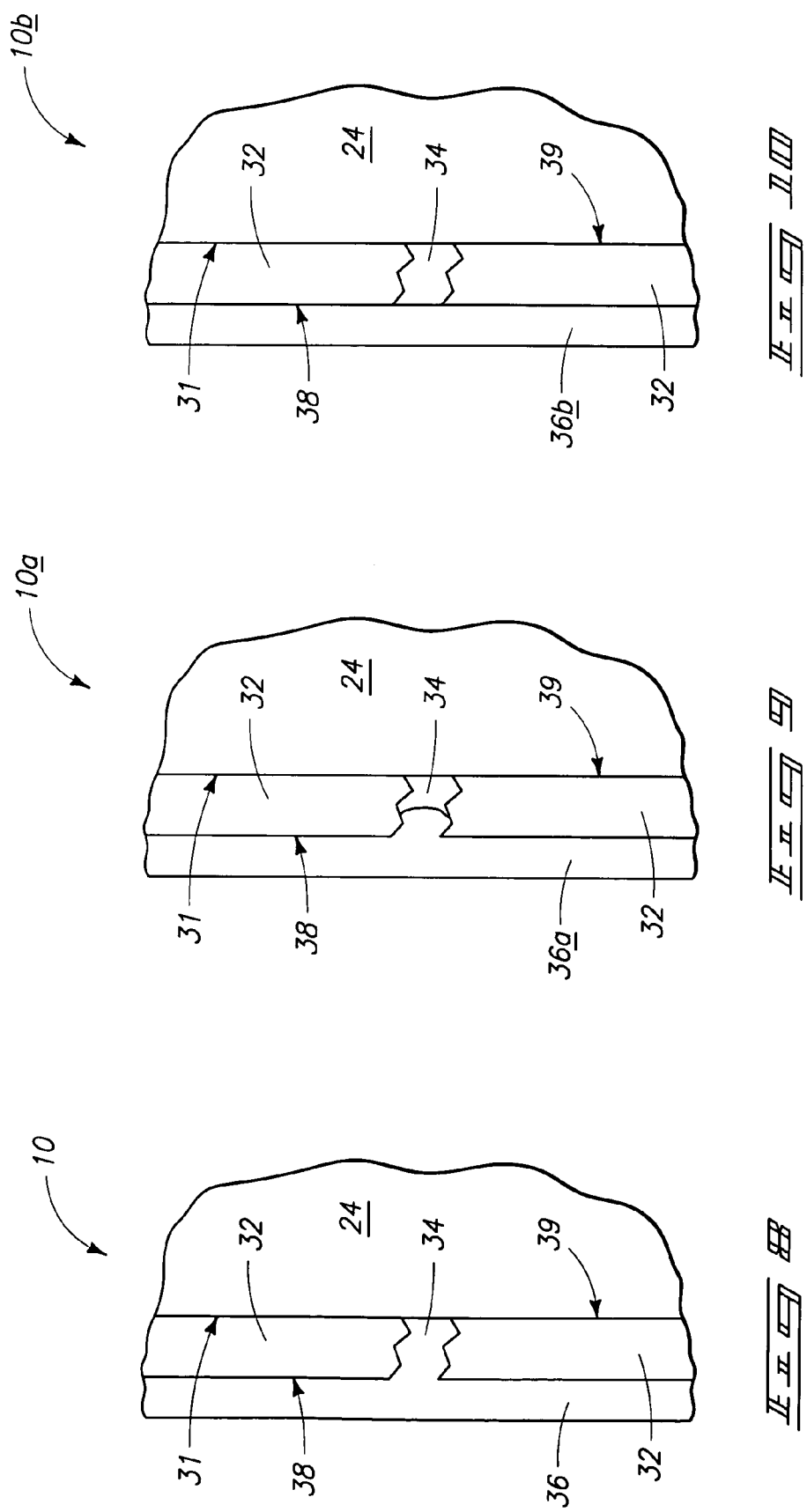

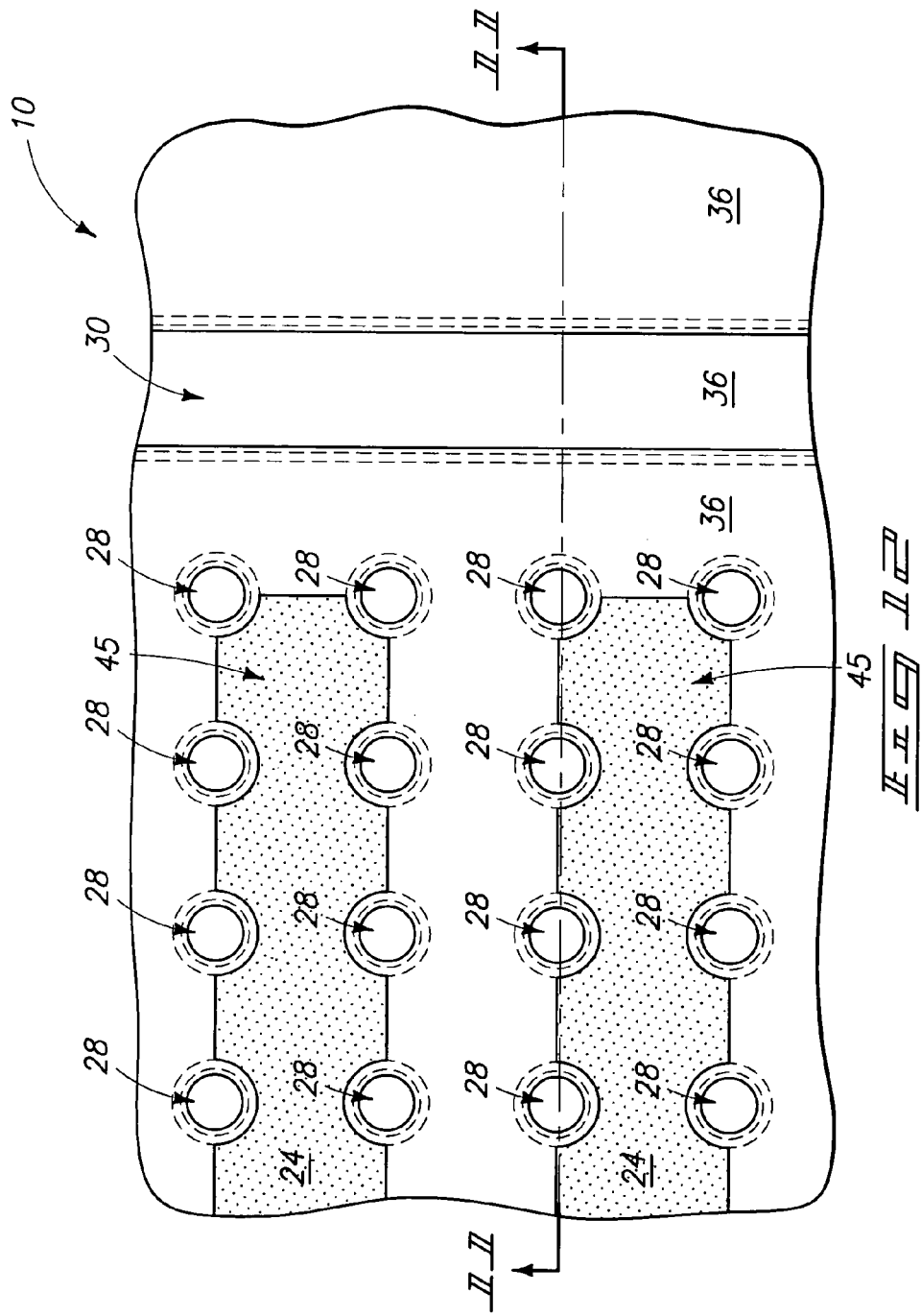

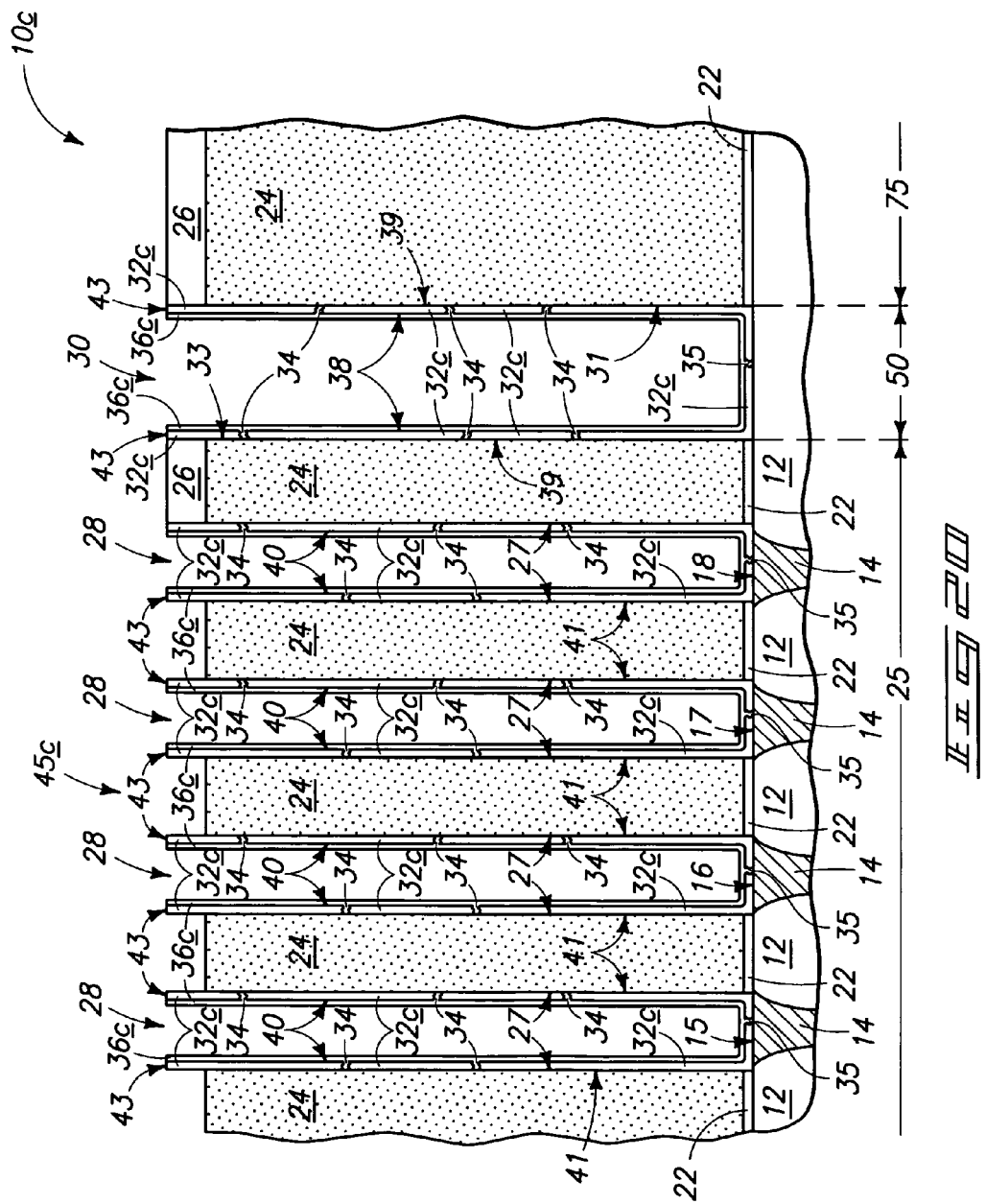

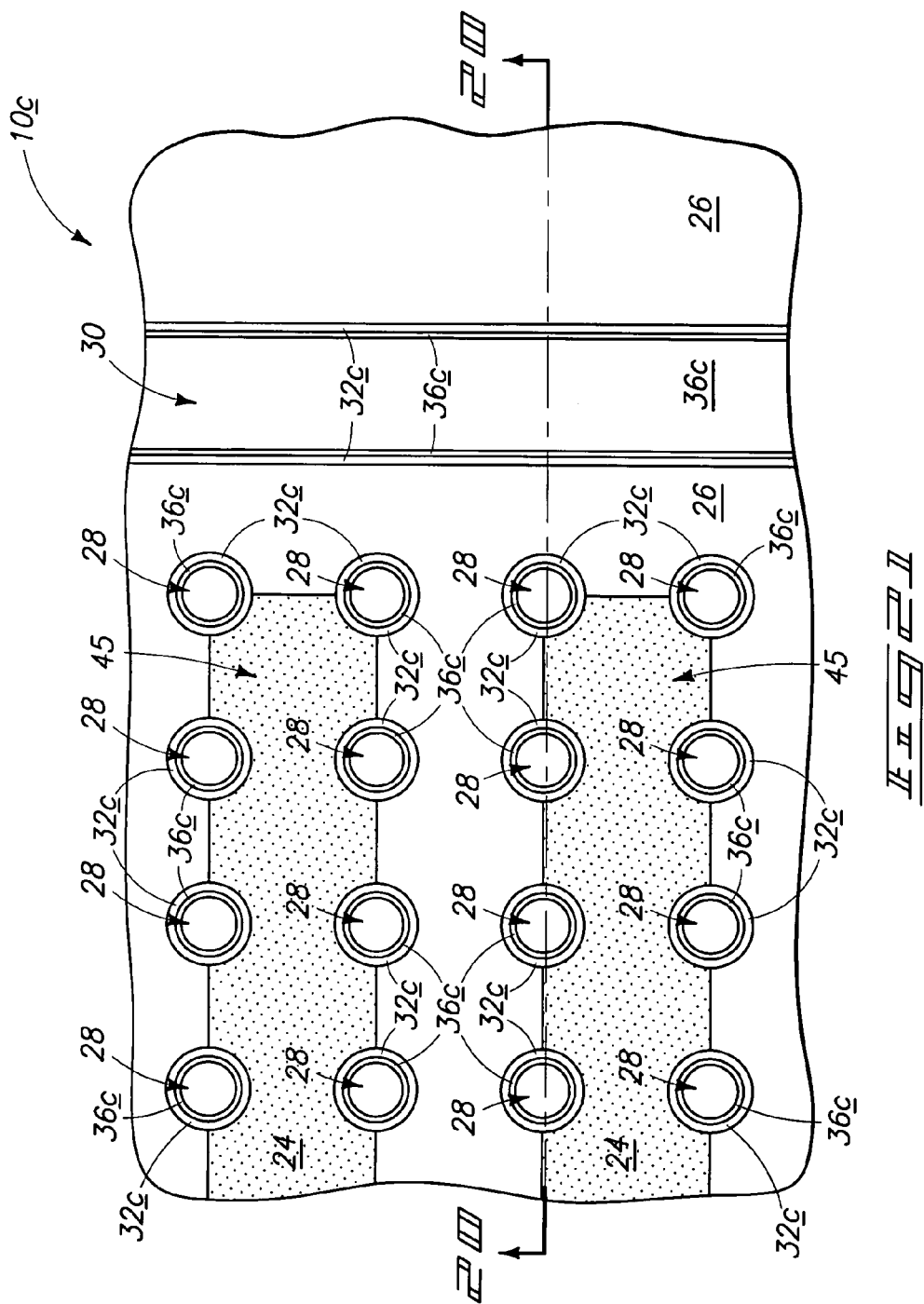

METHODS OF FORMING A PLURALITY OF CAPACITORS

TECHNICAL FIELD

This invention relates to methods of forming a plurality of capacitors.

BACKGROUND OF THE INVENTION

Capacitors are one type of component commonly used in the fabrication of integrated circuits, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. It can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area and thereby increased capacitance for the capacitors being formed. However, the capacitor electrodes formed in deep openings are typically correspondingly much taller than they are wide. This can lead to toppling of the capacitor electrodes, either during the etch to expose the outer sidewalls surfaces, during transport of the substrate, and/or during deposition of the capacitor dielectric layer or outer capacitor electrode layer. Our U.S. Pat. No. 6,667,502 teaches the provision of a brace or retaining structure intended to alleviate such toppling. Other aspects associated in the formation of a plurality of capacitors, some of which include bracing structures, are also disclosed and are:

U.S. Published Application No. 2005/0051822 A1;
U.S. Published Application No. 2005/0054159 A1;
U.S. Published Application No. 2005/0158949 A1;
U.S. Published Application No. 2005/0287780 A1;
U.S. Published Application No. 2006/0014344 A1;
U.S. patent application Ser. No. 10/928,931, filed Aug. 27, 2004, titled "Methods of Forming a Plurality of Capacitors", naming Brett W. Busch, Fred D. Fishburn and James Rominger as inventors;
U.S. patent application Ser. No. 10/929,037, filed Aug. 27, 2004, titled "Methods of Forming a Plurality of Capacitors", naming H. Montgomery Manning as inventor;
U.S. patent application Ser. No. 11/006,331, filed Dec. 6, 2004, titled "Methods of Forming Pluralities of Capacitors, and Integrated Circuitry", naming Cem Basceri and Gurtej S. Sandhu as inventors;
U.S. patent application Ser. No. 11/083,489, filed Mar. 18, 2005, titled "Methods of Forming Pluralities of Capacitors", naming Gurtej S. Sandhu and D. Mark Durcan as inventors;
U.S. patent application Ser. No. 11/131,552, filed May 18, 2005, titled "Methods of Forming Pluralities of Capacitors", naming H. Montgomery Manning as inventor;
U.S. patent application Ser. No. 11/131,575; filed May 18, 2005, titled "Methods of Forming a Plurality of Capacitors, and Integrated Circuitry Comprising a Pair of Capacitors", naming H. Montgomery Manning as inventor;
U.S. patent application Ser. No. 11/196,593; filed Aug. 2, 2005, titled "Methods of Forming Pluralities of Capacitors", naming Gurtej S. Sandhu, H. Montgomery Manning and Stephen J. Kramer as inventors;
U.S. patent application Ser. No. 11/272,232, filed Nov. 10, 2005, titled "Methods of Forming a Plurality of Capacitor Devices", naming H. Montgomery Manning, Thomas M. Graettinger and Marsela Pontoh as inventors; and
U.S. patent application Ser. No. 11/272,247, filed Nov. 10, 2005, titled "Methods of Forming a Plurality of Capacitor Devices", naming H. Montgomery Manning, Thomas M. Graettinger and Marsela Pontoh as inventors;

Typical fabrication of capacitors particularly common in memory circuitry forms an array of capacitors within a capacitor array area. Control or other circuitry area is typically displaced from the capacitor array area, with the substrate including an intervening area between the capacitor array area and the control or other circuitry area. In some instances, a trench is formed in the intervening area between the capacitor array area and the other circuitry area. Such trench can be formed commensurate with the fabrication of the openings within the capacitor array area within which the isolated capacitor electrodes will be received.

When etching the insulative electrode-forming material within which the capacitor electrodes are received to expose outer sidewall surfaces thereof, it is typically desired that none of the insulative material within the other circuitry area be etched. One prior art method restricts such by masking the peripheral circuitry area. Specifically, a silicon nitride layer is typically formed over the predominantly insulative material within which the capacitor electrodes are formed. The conductive material deposited to form the capacitor electrodes within the electrode openings also deposits and lines the trench between the capacitor array area and the peripheral circuitry area. A typical common conductive material is titanium nitride. The titanium nitride is polished back at least to the silicon nitride layer, thereby forming isolated container-shaped structures within individual capacitor electrode openings in the array area and within the trench. Accordingly, the sidewalls and bottom of the trench are covered or masked with titanium nitride, whereas the top or elevationally outermost surface of the peripheral or other circuitry area is covered with silicon nitride.

Etch access openings are then formed at spaced intervals within the silicon nitride within the capacitor array area to expose the insulative capacitor electrode-forming material there beneath. Elevationally outermost surfaces of the peripheral circuitry area are typically kept entirely masked with the silicon nitride layer. When the insulative capacitor electrode-forming material comprises phosphorus and/or boron doped silicon dioxide, a typical aqueous etching chemistry utilized to etch such highly selectively to titanium nitride and to silicon nitride is an aqueous HF solution. Such desirably results in exposure of the outer sidewalls of the individual capacitor electrodes while the peripheral insulative material remains masked from such etching by the overlying silicon nitride layer and from the titanium nitride within the peripheral trench.

Unfortunately, the titanium nitride from which the capacitor electrodes are formed and which masks the sidewalls of the peripheral trench can be deposited in a manner which produces cracks or pinholes that extend laterally therethrough. This is not particularly problematic within the capacitor array area as it is desired that the insulative material be removed from both the inner and outer lateral sidewalls of the capacitor electrodes. Passage of liquid etchant through any cracks or pinholes within the array area does not defeat this purpose. However, cracks or pinholes in the titanium nitride layer protecting the lateral sidewalls of the peripheral circuitry insulative material can be problematic. Specifically, etchant seeping therethrough can cause etching voids or pockets to form laterally within the peripheral circuitry insulative material. These can later create fatal contact-to-contact shorts in the peripheral circuitry area when conductive vertical contacts are formed therein.

One existing solution to such problem is to deposit a very thin polysilicon layer to line internal portions of the capacitor electrodes and against the titanium nitride layer which laterally covers the insulative material of the peripheral circuitry area. Polysilicon is highly resistant to etch by HF. Such will shield any pinholes, thereby precluding HF or other etchants from seeping therethrough and undesirably etching the peripheral circuitry area insulative material.

Polysilicon is typically undesired subsequently, and is therefore removed. Accordingly, after etching back the insulative material to expose the outer sidewalls of the capacitor electrodes, a dedicated wet etch is typically conducted to highly selectively remove the polysilicon relative to undoped silicon dioxide, the titanium nitride, and the silicon nitride. Prior to this, a separate dedicated wet etch is typically conducted to remove an undesired native oxide which forms over the polysilicon.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

FIG. 8 is an enlarged view of a portion of the FIG. 7 substrate fragment.

FIG. 9 is a view of an alternate embodiment substrate fragment to that depicted by FIG. 8.

FIG. 10 is a view of another alternate embodiment substrate fragment to that depicted by FIG. 8.

FIG. 12 is a diagrammatic top plan view of the FIG. 11 substrate fragment.

FIG. 13 is a view of the FIG. 11 substrate at a processing step subsequent to that shown by FIG. 11.

FIG. 20 is a view of the FIG. 19 substrate at a processing step subsequent to that shown by FIG. 19, and taken through line 20-20 in FIG. 21.

FIG. 21 is a diagrammatic top plan view of the FIG. 20 substrate fragment.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
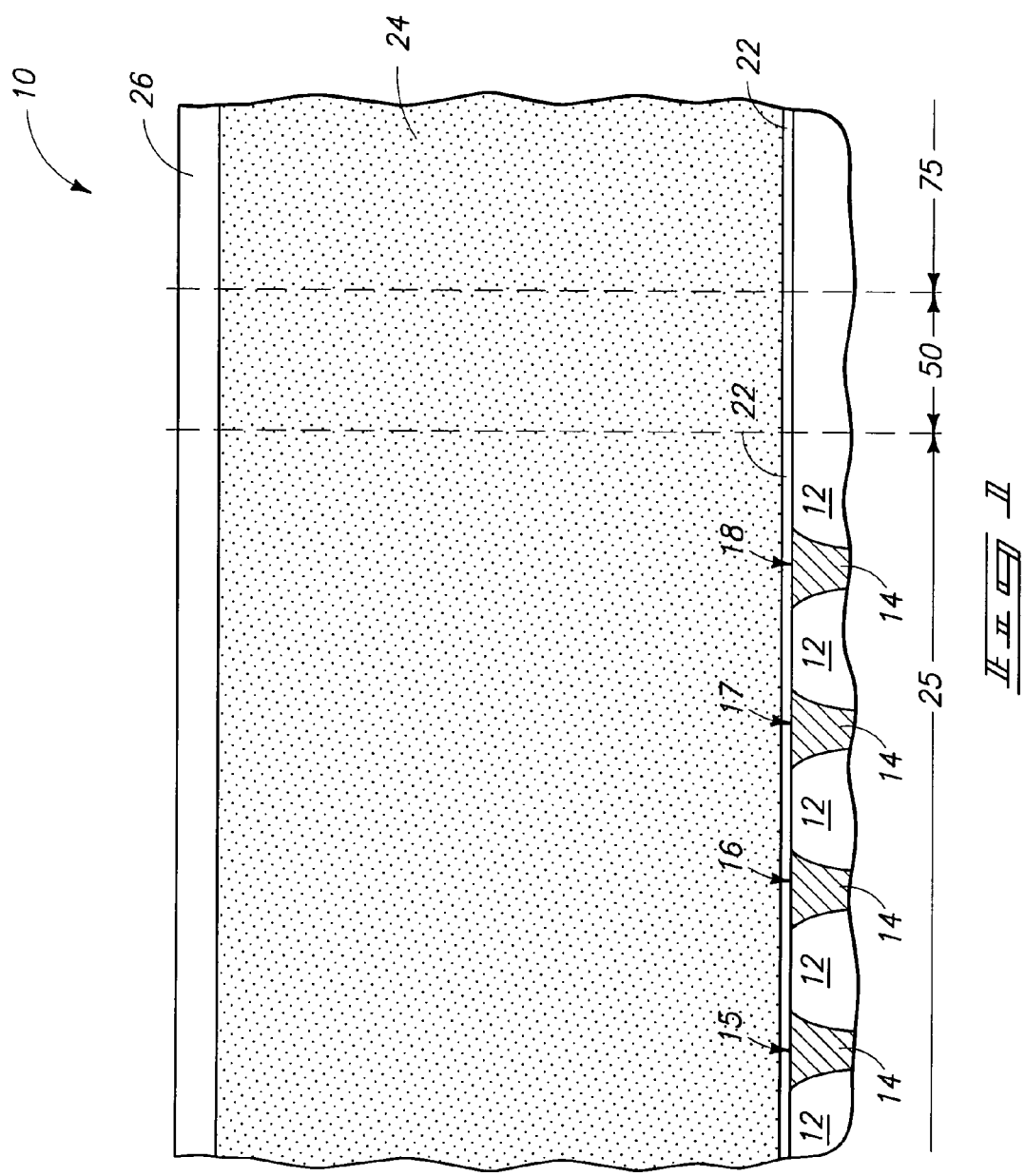
FIG. 1 is a diagrammatic cross section of a substrate fragment in process in accordance with an aspect of the invention.
Figure 2:
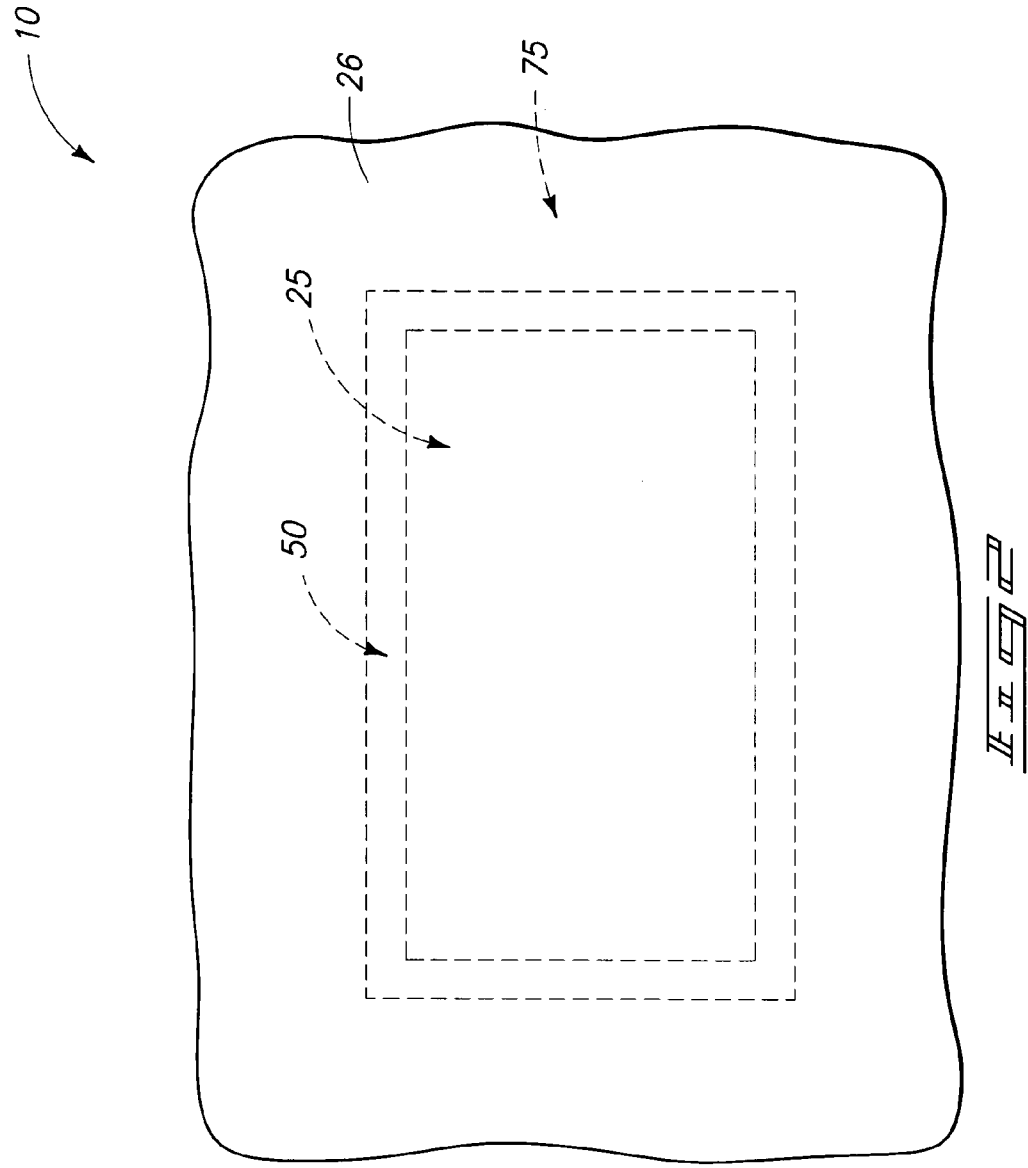
FIG. 2 is a diagrammatic top plan view of a larger scale portion of the FIG. 1 substrate.

Exemplary preferred methods of forming pluralities of capacitors are described with reference to FIGS. 1-17. Referring initially to FIGS. 1 and 2, a substrate, preferably a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, FIG. 1 might comprise a bulk semiconductor material (not shown), for example bulk monocrystalline, and/or comprise semiconductor-on-insulator layers.

Substrate 10 can be considered as comprising a capacitor array area 25, a circuitry area 75 other than capacitor array area 25, and an intervening area 50 between capacitor array area 25 and circuitry area 75. In the depicted exemplary preferred embodiment, intervening area 50 completely surrounds and encircles capacitor array area 25 (FIG. 2), and circuitry area 75 comprises a peripheral circuitry area to that of capacitor array area 25. Alternate constructions are contemplated, of course, for example whereby neither intervening area 50 nor circuitry area 75 completely or partially encircles a capacitor array area 25.

FIG. 1 depicts an insulative material 12 having electrically conductive storage node pillars 14 formed therethrough.

Materials 12 and 14 would typically be fabricated over some suitable underlying material, for example bulk monocrystalline and/or underlying circuitry. An exemplary insulative material 12 includes doped and undoped silicon dioxides, for example silicon dioxide deposited by the decomposition of tetraethylorthosilicate (TEOS) and/or borophosphosilicate glass (BPSG) and/or silicon nitride. Alternately by way of example only, material 12 might comprise anisotropically etched insulative sidewall spacers, for example formed about transistor gate lines (not shown). An exemplary preferred material 14 is conductively doped polysilicon. Conductive material 14 can be considered as comprising or defining a plurality of capacitor storage node locations 15, 16, 17 and 18 on substrate 10. Storage node locations 15, 16, 17 and 18 are exemplary only, and regardless, may be conductive at this point in the process, or made conductive subsequently.

A preferred layer 22 has been formed over material 12 and capacitor storage node locations 15, 16, 17 and 18. An exemplary preferred material for layer 22 comprises silicon nitride and/or undoped silicon dioxide deposited to an exemplary thickness range of from 100 Angstroms to 2,000 Angstroms. Layer 22 might be included to provide an etch stop, or other function.

Some insulative material 24 is received over capacitor array area 25 and circuitry area 75, and also in the depicted embodiment over intervening area 50. Such might be homogeneous or comprise multiple different compositions and/or layers. An exemplary preferred material is silicon dioxide comprising at least one of phosphorus and boron, for example BPSG, borosilicate glass (BSG), and/or phosphosilicate glass (PSG). An exemplary preferred thickness range for material 24 is from 5,000 Angstroms to 10 microns, with 2 microns being a specific preferred example. Thinner and greater thicknesses are, of course, contemplated.

A first silicon nitride-comprising layer 26 is received over insulative material 24. Such preferably comprises, consists essentially of, or consists of silicon nitride. An exemplary preferred thickness range is from 200 Angstroms to 5,000 Angstroms. Reference to "first" with respect to layer 26 is for convenience only with respect to a later designated "second" silicon nitride-comprising layer, as will be apparent from the continuing discussion. Further, reference to "first" does not necessarily indicate that exemplary preferred layer 26 is a first ever silicon nitride-comprising layer, nor necessarily first temporally formed with respect to the later-described second silicon nitride-comprising layer. Some or all of layer 26 might be removed, or some or all of layer 26 might remain over the substrate as part of finished circuitry construction incorporating a plurality of capacitors being fabricated. Material other than silicon nitride might also be utilized, and the invention contemplates aspects which do not necessarily require a silicon nitride-comprising or masking layer 26.

Figure 3:
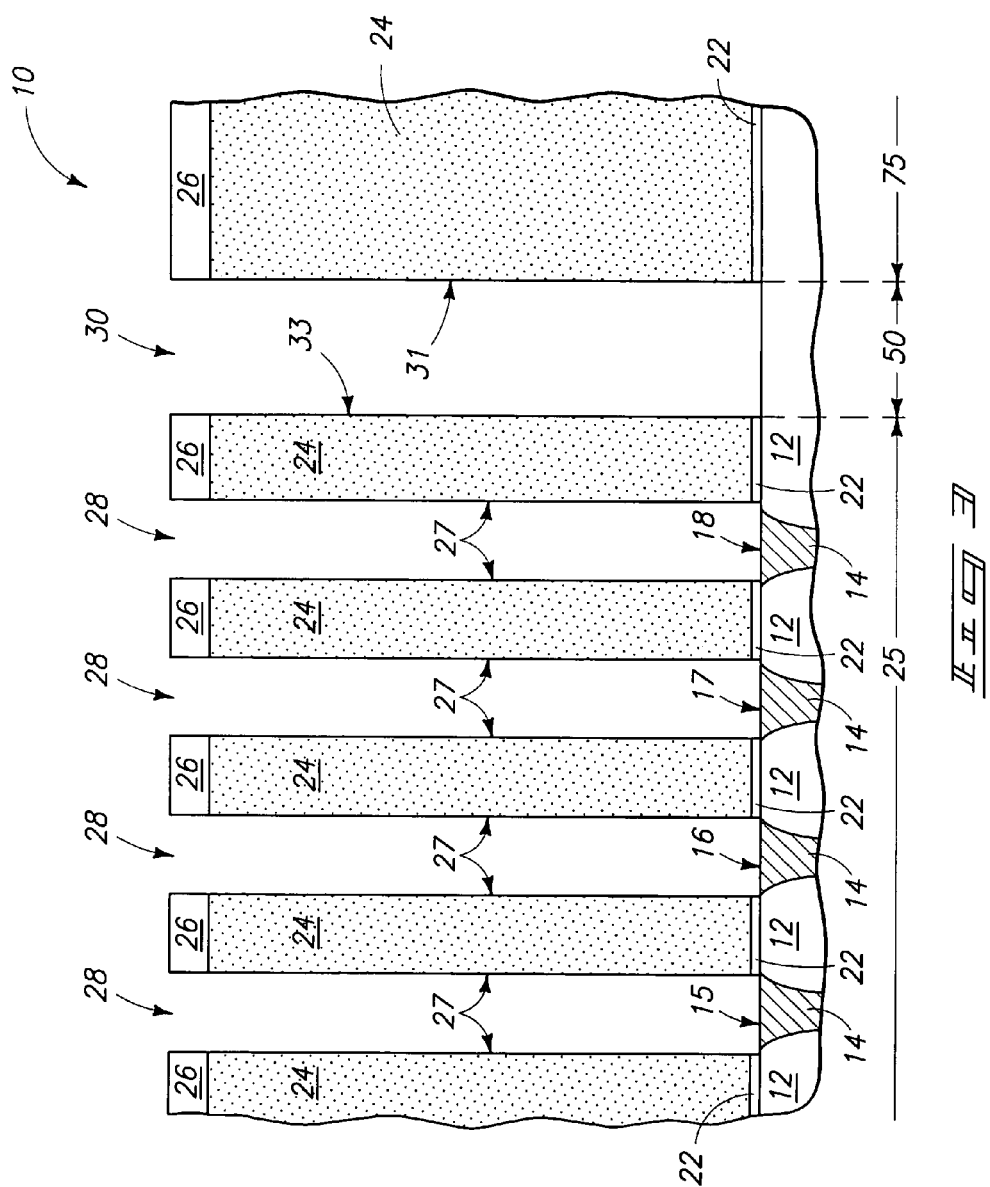
FIG. 3 is a view of the FIG. 1 substrate at a processing step subsequent to that shown by FIG. 1, and taken through line 3-3 in FIG. 4.
Figure 4:
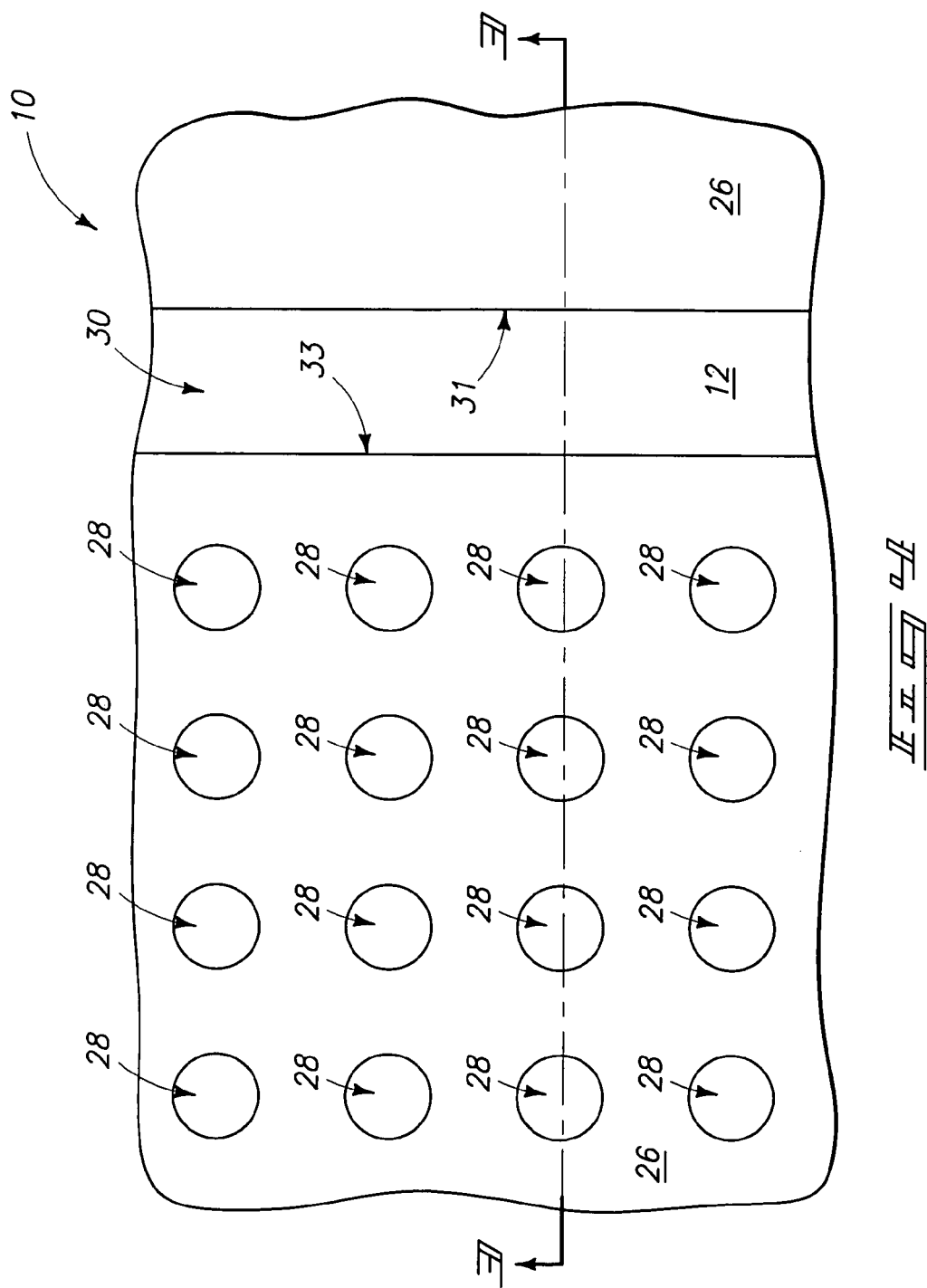
FIG. 4 is a diagrammatic top plan view of the FIG. 3 substrate fragment.

Referring to FIGS. 3 and 4, a plurality of capacitor electrode openings 28 have been formed within first silicon nitride-comprising layer 26, insulative material 24, and layer 22 over individual capacitor storage node locations 15, 16, 17 and 18. Further, a trench 30 has been formed in intervening area 50 within materials 26, 24 and 22. In an exemplary preferred embodiment, trench 30 completely surrounds capacitor area 25. An exemplary preferred technique for forming capacitor electrode openings 28 and trench 30 comprises photolithographic patterning and selective anisotropic dry etching to produce the exemplary FIGS. 3 and 4 constructions. An exemplary minimum width of trench opening 30 is from 200 Angstroms to 5,000 Angstroms, while an exemplary minimum width for capacitor electrode openings 28 is from 200 Angstroms to 5,000 Angstroms. For purposes of the continuing discussion, trench 30 can be considered as comprising sidewall portions 31 and 33, and capacitor electrode openings 28 have sidewall portions 27.

Figure 5:
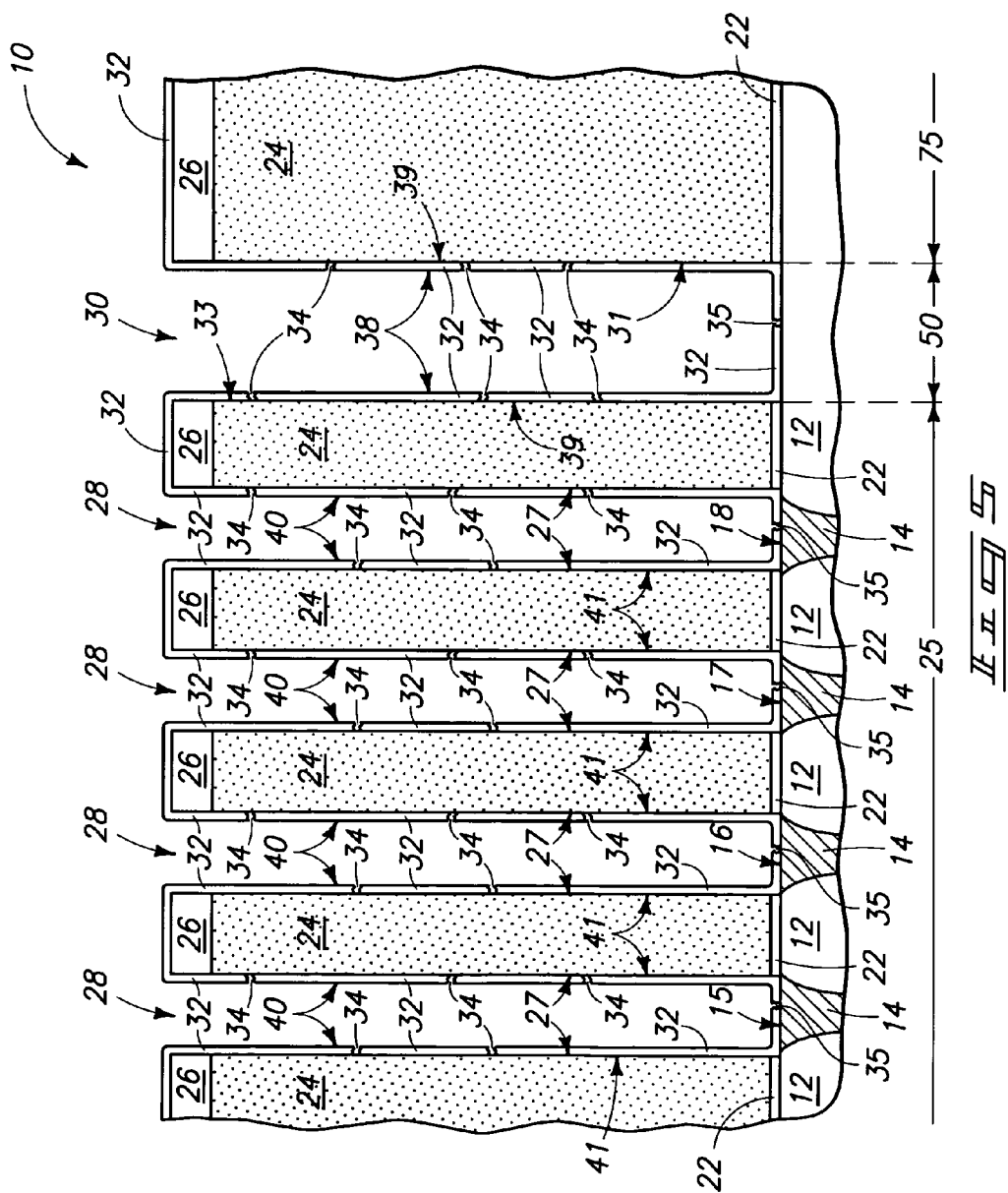
FIG. 5 is a view of the FIG. 3 substrate at a processing step subsequent to that shown by FIG. 3.

Referring to FIG. 5, conductive material 32 has been formed within capacitor electrode openings 28, and within trench 30 at least against a portion of sidewall portion 31 to less than completely fill trench 30. In the depicted preferred and exemplary embodiment, conductive material 32 also less than fills capacitor electrode openings 28, and lines sidewalls portions 27 of capacitor electrode openings 28. Conductive material 32 can be considered as having inner sidewalls 40 and outer sidewalls 41 within capacitor electrode openings 28 within capacitor array area 25, and inner sidewalls 38 and outer sidewalls 39 within trench 30. An exemplary preferred conductive material 32 comprises titanium nitride deposited to an exemplary thickness from 20 Angstroms to 1,000 Angstroms. Alternately but less preferred, conductive material 32 might fill capacitor electrode openings 28.

In conjunction with a problem which motivated aspects of the invention described herein, conductive material 32 within trench 30 comprises some opening 34 extending laterally therethrough to insulative material 24 received over circuitry area 75. Such might be in the form of one or more pinholes, through-extending cracks, etc., with an exemplary plurality of such openings 34 being indicated by way of example only. Exemplary such laterally extending cracks/openings 34 are also shown within conductive material 32 within capacitor electrode openings 28. Further, exemplary opening/cracks 35 are shown in conductive material 32 at the bases of openings 28 and 30. Regardless, aspects of the invention do however contemplate fewer or no such openings 34/35 being formed.

Figure 6:
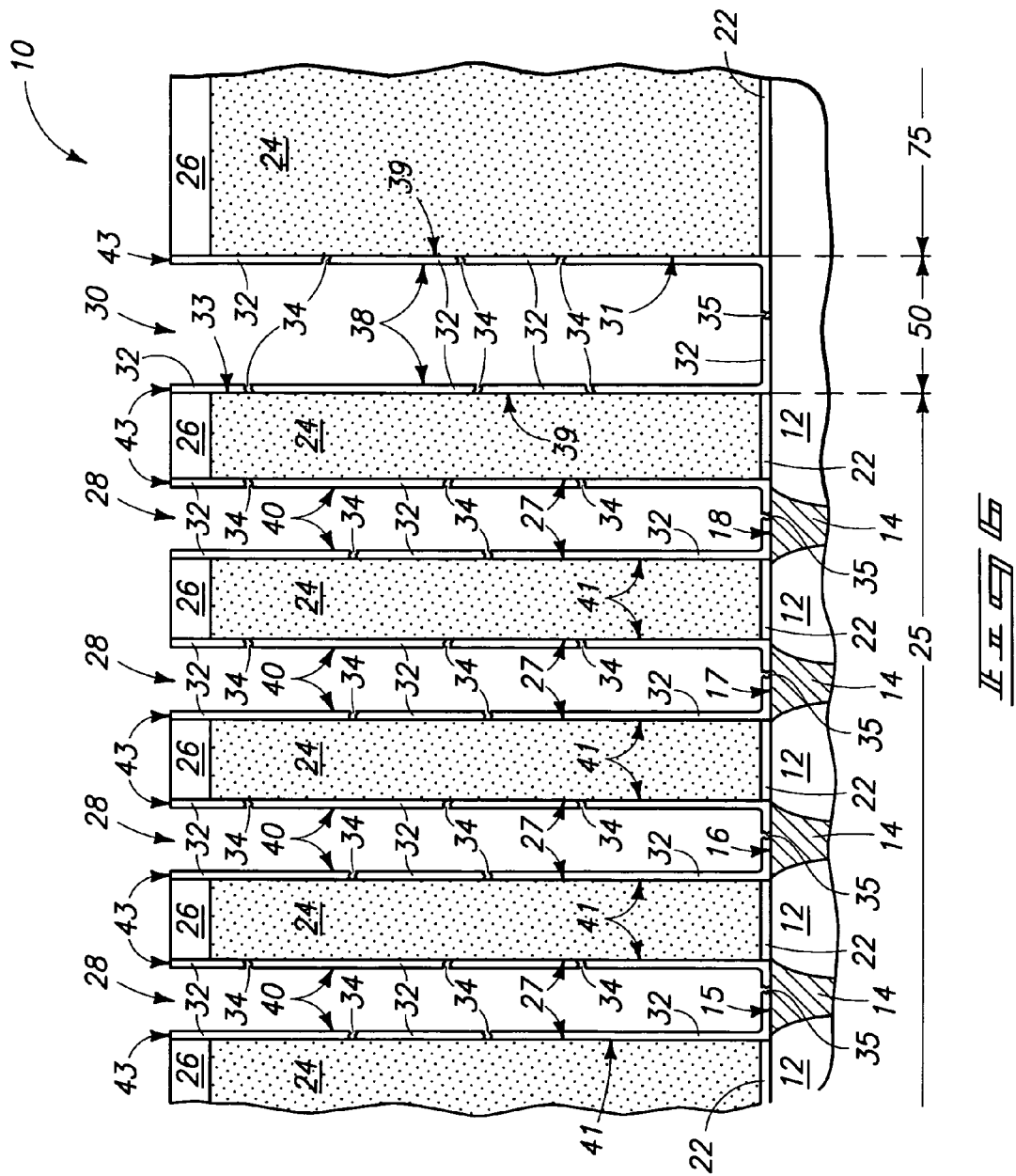
FIG. 6 is a view of the FIG. 5 substrate at a processing step subsequent to that shown by FIG. 5.

Referring to FIG. 6, conductive layer 32 has been planarized back at least to an outer surface of first silicon nitride-comprising layer 26, thereby forming isolated/separate capacitor electrodes within capacitor electrode openings 28 and an isolation structure within trench 30. For purposes of the continuing discussion, conductive layer 32 can be considered as having an elevationally outermost surface 43.

Figure 7:
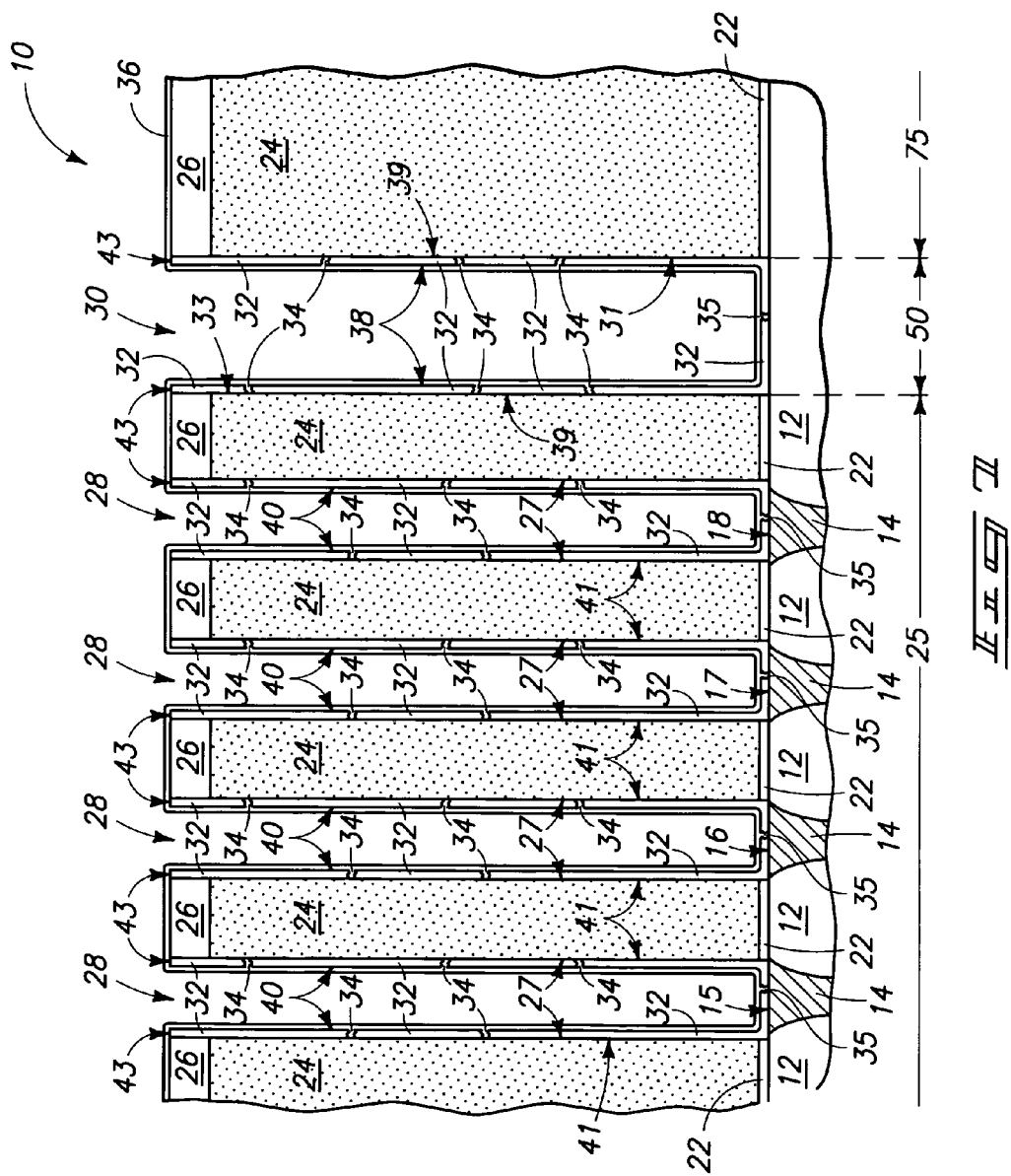
FIG. 7 is a view of the FIG. 6 substrate at a processing step subsequent to that shown by FIG. 6.

Referring to FIG. 7, conductive material 32 received over sidewall portion 31 of trench 30 has been covered with a silicon nitride-comprising layer 36 which less than fills the remaining volume of trench 30. Such layer 36 is depicted as being provided at this point in the process, although such might be provided subsequently, as will be described below. Layer 36 might comprise multiple layers and/or materials, and at least includes some silicon nitride. Layer 36 might be deposited, by way of example only, by any suitable CVD and/or ALD process and whether existing or yet to be developed. By way of example only, CVD and/or ALD processes might use any of dichlorosilane, hexachlorodisilane, trisilyl amine, and/or ammonia as deposition precursors. Pressure is preferably subatmospheric (i.e., from 50 mTorr to 5000 mTorr), with an exemplary deposition temperature range being from 400° C. to 800° C.

In the depicted preferred embodiment, a second silicon nitride-comprising layer 36 covers inner sidewalls 40 of conductive material 32 within capacitor electrode openings 28 and inner sidewalls 38 of conductive material 32 within trench 30, and less than fills the remaining volume of capacitor electrode openings 28 and trench 30. Preferably and as shown, silicon nitride-comprising layer 36 preferably covers the top, sidewalls and base/bottom of conductive material 32. In one preferred implementation, silicon nitride-comprising layer 36 has a thickness no greater than 500 Angstroms, more preferably no greater than 100 Angstroms, and even more preferably no greater than 75 Angstroms, with a specific preferred exemplary range being from 20 Angstroms to 60 Angstroms.

Some of silicon nitride-comprising layer 36 might be received within laterally extending openings 34. FIGS. 7 and 8 depict an exemplary embodiment wherein silicon nitride-comprising layer 36 fills a laterally extending opening 34. Alternately, by way of example only, silicon nitride-comprising layer 36 might only partially fill opening 34, or perhaps not at all fill opening 34 and completely bridge thereover. By way of example only, FIG. 9 shows an exemplary embodiment substrate 10a wherein opening 34 is only partially filled with a silicon nitride-comprising layer 36a. Like numerals form the first-described embodiment are utilized where appropriate, with differences being indicated with the suffix "a". FIG. 10 depicts an exemplary alternate embodiment substrate fragment 10b wherein a silicon nitride-comprising layer 36b is not received within any portion of laterally extending opening 34, and completely bridges thereover. Like numerals from the first-described embodiment are utilized where appropriate, with differences being indicated with the suffix "b". The minimum width of openings 34 and degree of conformality in the deposition of layer 36 might impact degree of filling/bridging of openings 34.

Figure 11:
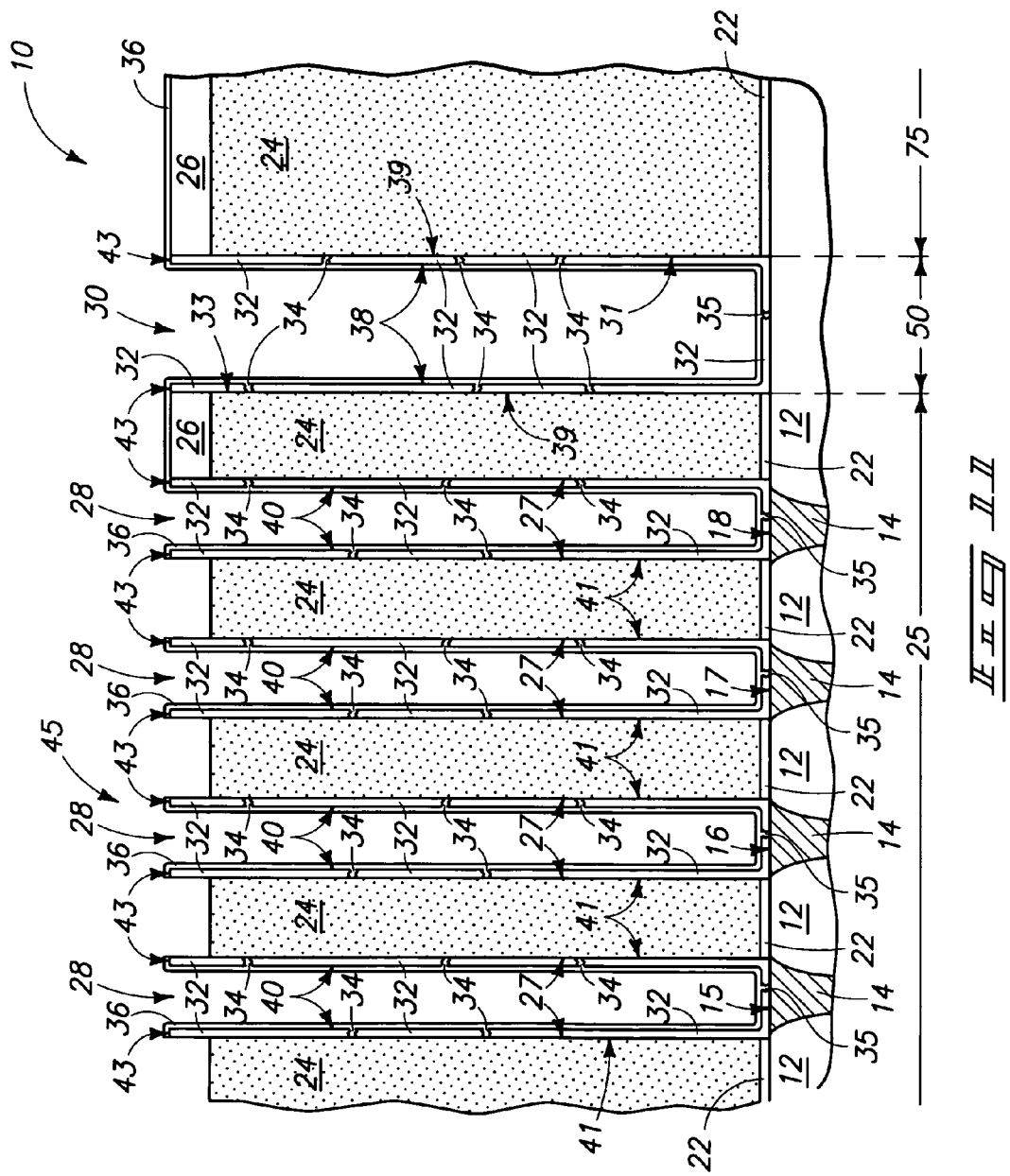
FIG. 11 is a view of the FIG. 7 substrate at a processing step subsequent to that shown by FIG. 7, and taken through line 11-11 in FIG. 12.
Figure 11:
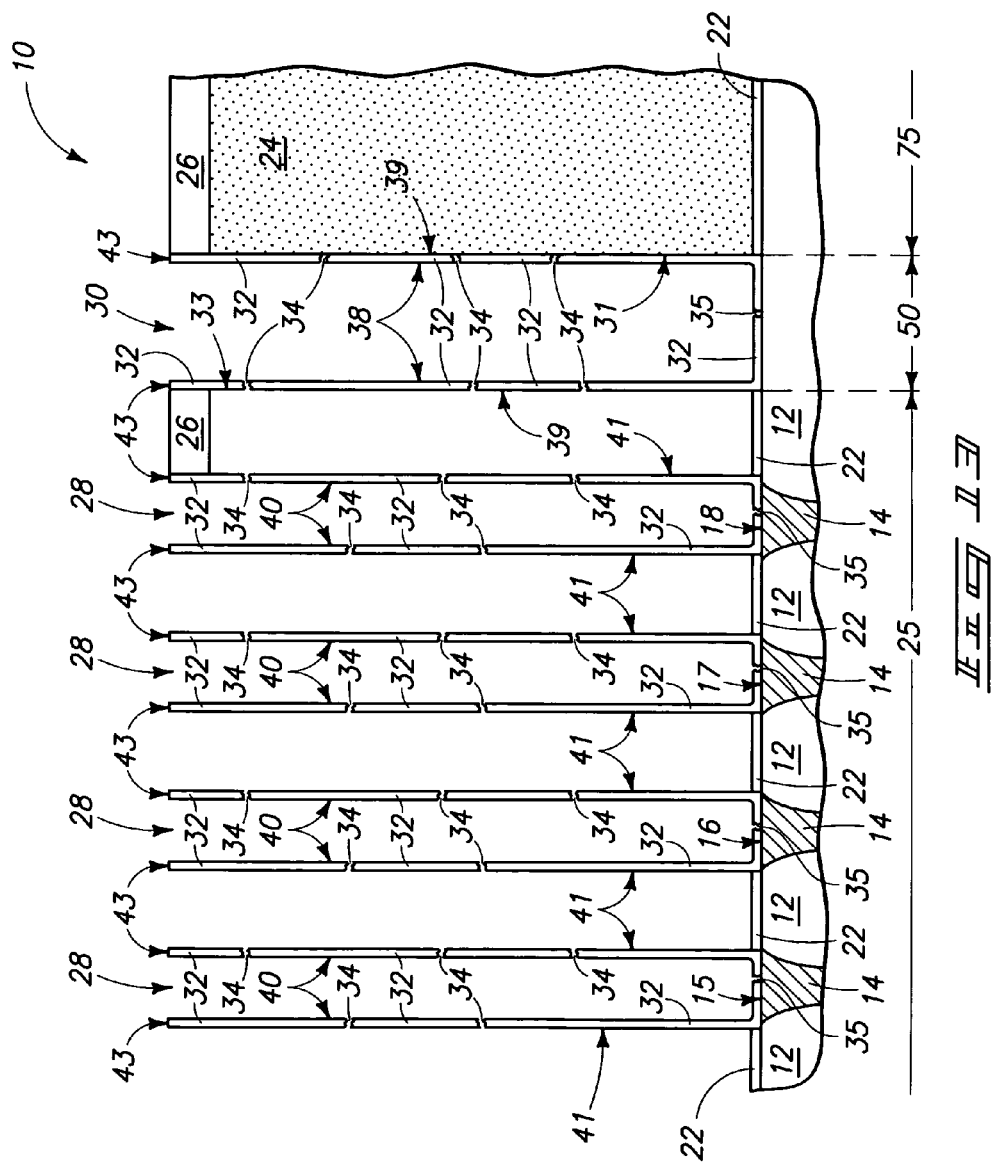

Referring to FIGS. 11 and 12, etch openings 45 have been formed through first silicon nitride-comprising layer 26 within capacitor array area 25 effective to expose insulative material 24 within capacitor array area 25 while leaving the elevationally outermost surfaces of insulative material 24 within circuitry area 75 completely covered with first silicon nitride-comprising layer 26. Such provide access for etchant to get to and etch material 24 within capacitor array area 25.

Referring to FIG. 13, insulative material 24 within capacitor array area 25 and silicon nitride-comprising layer 36 have been etched with a liquid etching solution effective to expose outer sidewall portions of outer sidewalls 41 of conductive material 32 within capacitor array area 25, and to expose conductive material 32 within trench 30. Such etching is also depicted as being effective to expose inner portions of inner sidewalls 40 of conductive material 32 within capacitor array area 25. In one most preferred implementation and as shown, the etching is effective to remove all remaining of silicon nitride-comprising layer 36 from within trench 30, and even further preferably all remaining of silicon nitride-comprising layer 36 from the substrate. Alternately but less preferred, some of silicon nitride-comprising layer 36 might remain on the substrate. Further in the depicted preferred embodiment, silicon nitride-comprising layer 36 covers elevationally outermost surface 43 of conductive material 32 during such etching.

Figure 14:
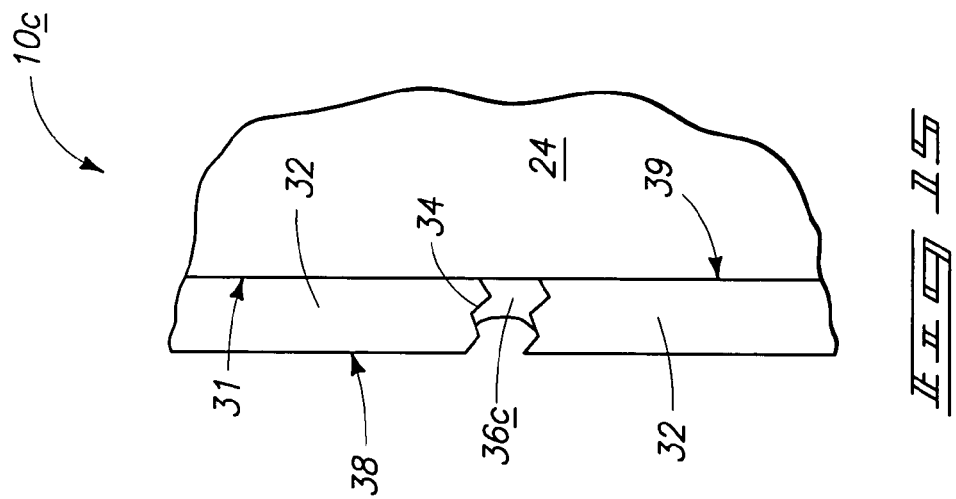
FIG. 14 is an enlarged view of a portion of the FIG. 13 substrate fragment.
Figure 15:
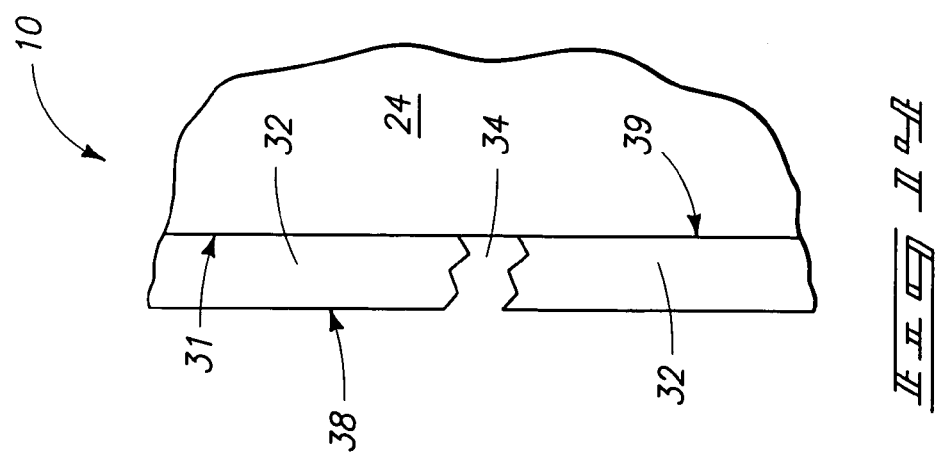
FIG. 15 is a view of an alternate embodiment substrate to that depicted by FIG. 14.

Regardless, the etching might be effective to expose insulative material 24 received over circuitry area 75 through a laterally extending opening 34 in conductive material 32, as is shown. Alternately, for example at least wherein some of silicon nitride-comprising layer 36 is received within laterally extending opening 34, the etching might be conducted to be ineffective to remove all silicon nitride from within laterally extending opening 34. For example, FIGS. 13 and 14 depict the complete removal of layer 36 from within laterally extending opening 34. FIG. 15 depicts an alternate exemplary embodiment substrate fragment 10c wherein the etching has been ineffective to remove all of the silicon nitride from within laterally extending opening 34, whereby some remnant of layer 36c is depicted as being received therein. Like numerals form the first-described embodiment are utilized where appropriate, with differences being indicated with the suffix "c".

An exemplary preferred liquid etchant solution is aqueous, and regardless for example comprising HF. One preferred exemplary solution comprises from 5:1 to 20:1 water to HF by volume, wherein said HF is a 49 weight percent solution of HF in water. An exemplary preferred etching temperature is room ambient, with an exemplary preferred etching pressure also being room ambient. However, temperatures and pressures below and above room ambient are also contemplated.

By way of example only, a 10:1 by volume water to HF solution per the above can be used to etch PSG at a rate of approximately from 5,000 Angstroms/minute to 15,000 Angstroms/minute, while etching a layer consisting essentially of silicon nitride at a rate of from 20 Angstroms/minute to 80 Angstroms/minute. Accordingly, nitride thickness could be selected and optimized in conjunction with the selection and modifying of etch conditions and etch times such that a desired amount of silicon nitride-comprising layer 36 is removed during etch back to expose the outer surfaces of the capacitor electrodes, and preferably, with a degree of overetch such that all silicon nitride is removed without damaging etch of insulative material 24 received over circuitry area 75 when openings 34 might be present. In a preferred implementation, thereby, the removal of a silicon nitride-comprising liner material 36 and the etch back of insulative material 34 can occur in a single step, as opposed to at least one step, and typically two steps, as described in the prior art "Background" section above wherein a native oxide and polysilicon were removed. By way of example only, additional exemplary HF-containing solutions might contain any one or combination of $HNO_3$, acetic acid, $NH_4F$, and proprionic acid.

Figure 16:
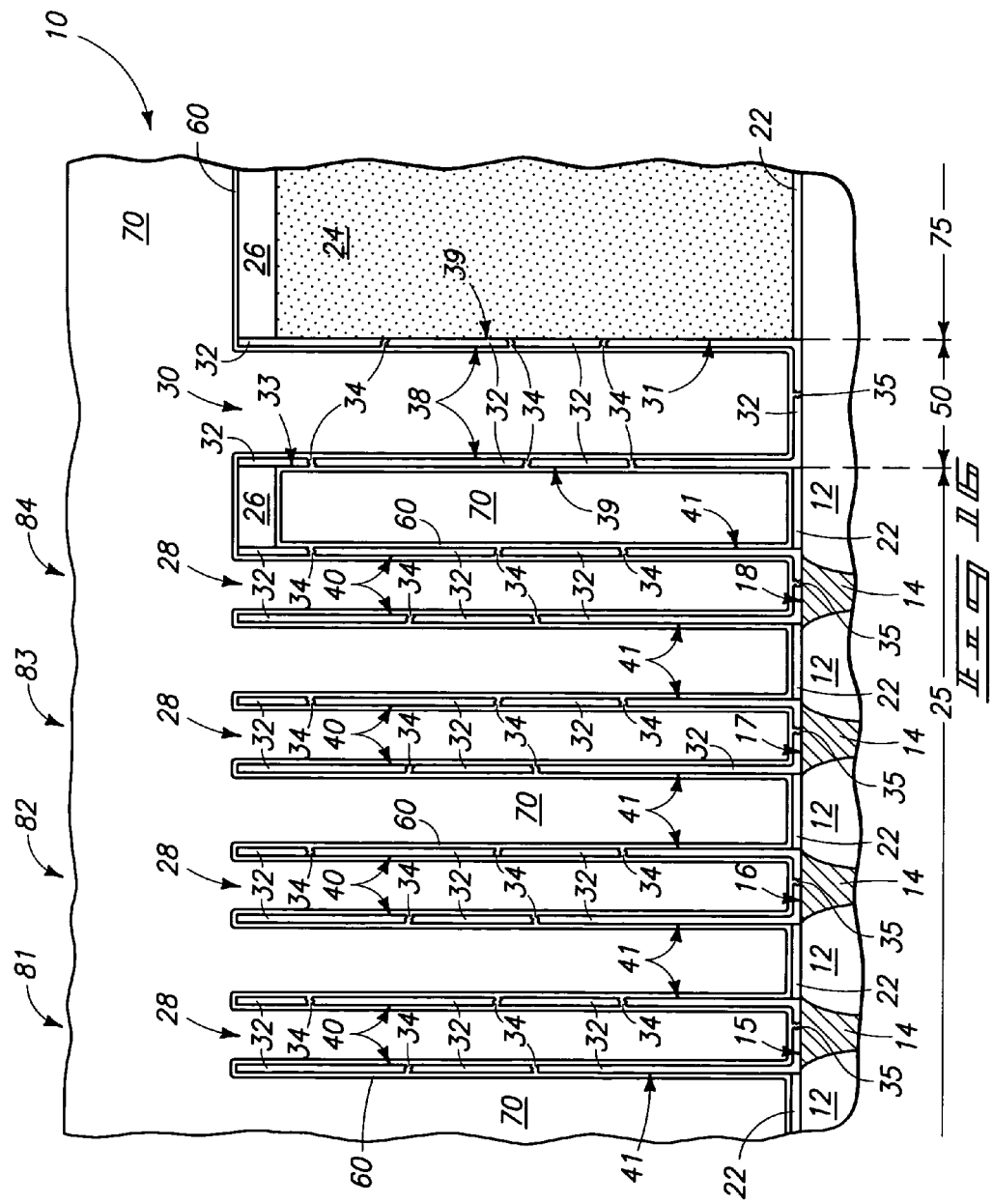
FIG. 16 is a view of the FIG. 13 substrate at a processing step subsequent to that shown by FIG. 13.

Conductive material 32 within capacitor array area 25 is incorporated into a plurality of capacitors. For example, FIG. 16 depicts the deposition of a capacitor dielectric layer 60. By way of example only, an exemplary preferred material is a silicon dioxide, silicon nitride, silicon dioxide composite, or any suitable high k dielectric, whether existing or yet-to-be developed. By way of example only, exemplary high k dielectrics include $Ta_2O_5$ and barium strontium titanate.

Figure 17:
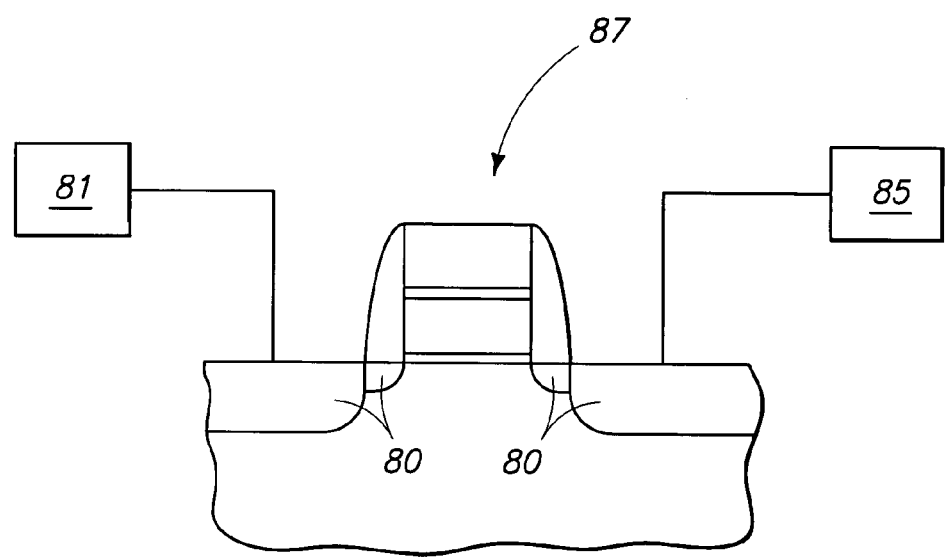
FIG. 17 is a diagrammatic representation of DRAM circuitry.

An outer capacitor electrode layer 70 has been deposited over capacitor dielectric layer 60, thereby defining capacitors 81, 82, 83 and 84. Such are depicted as comprising a common cell capacitor plate to all of the depicted capacitors, for example as might be utilized in DRAM or other circuitry. For example and by way of example only, FIG. 17 depicts an exemplary DRAM cell incorporating capacitor 81. Such comprises an exemplary transistor gate wordline 87 having insulative sidewall spacers, an insulative cap and a conductive region under the cap such as a silicide, a conductive polysilicon region under the silicide, and a gate dielectric region under the polysilicon. Source/drain regions 80 are shown formed within semiconductive material operatively proximate wordline 87. One of such electrically connects with capacitor 81, and another such electrically connects with a bitline 85.

The above-described embodiment depicts at least some of silicon nitride masking layer 26 remaining as part of the finished circuitry construction. Further, any one or combination of the capacitor bracing structures referred to above in the "Background" section might be utilized. Alternately but less preferred, no bracing might be utilized.

Figure 18:
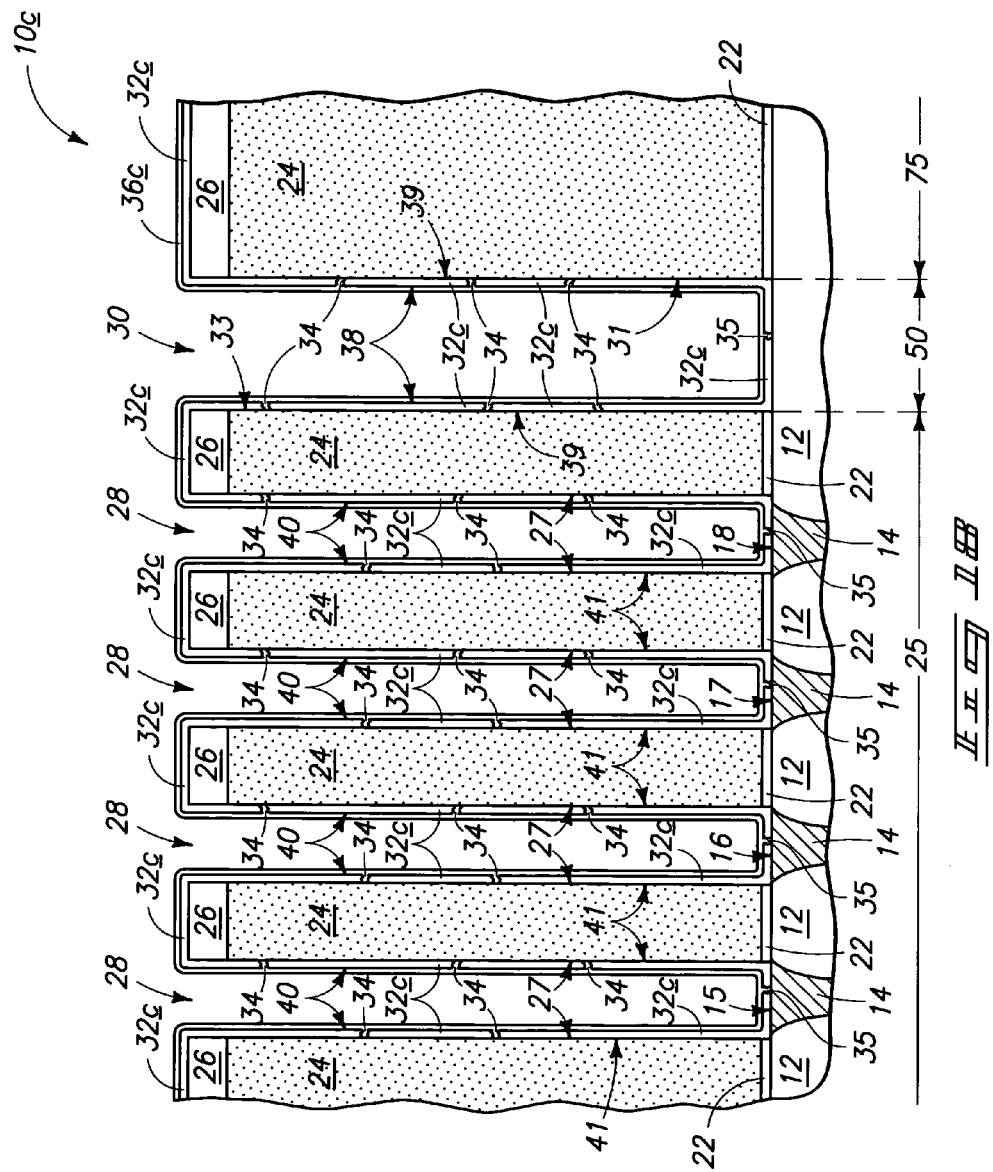
FIG. 18 is a diagrammatic cross section of an alternate embodiment substrate fragment in process in accordance with an aspect of the invention.

The above exemplary preferred embodiments formed isolated capacitor electrodes first within capacitor electrode openings 28 by polishing conductive material 32 back at least to an outer surface of masking layer 26, and then silicon nitride-comprising layer 36 deposited over the substrate. Alternately by way of example only, silicon nitride-comprising layer 36 might be deposited prior to any polishing/planarizing back of conductive layer 32. Such an exemplary alternate embodiment is shown in FIGS. 18-21. Like numerals from the first described embodiment have been utilized where appropriate, with differences being indicated with the suffix "c". FIG. 18 depicts layer 36c received over layer 32c. Attributes of layers 32c and 36c are preferably the same as those described above for layers 32 and 36 respectively.

Figure 19:
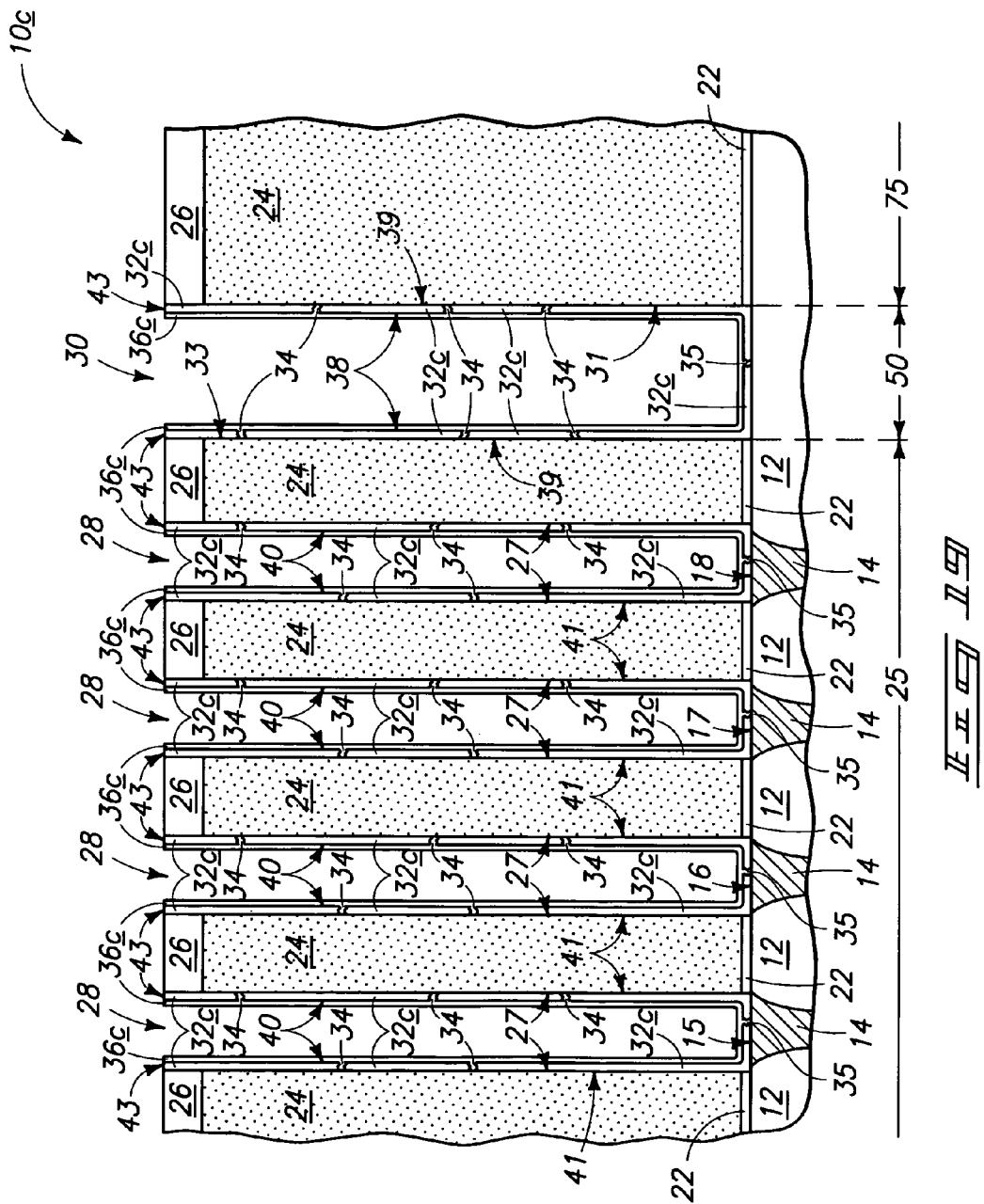
FIG. 19 is a view of the FIG. 18 substrate at a processing step subsequent to that shown by FIG. 18.

FIG. 19 depicts silicon nitride-comprising layer 36c and conductive layer 32c having been planarized back at least to an outer surface of first silicon nitride-comprising layer 26, thereby forming isolated/separate capacitor electrodes within capacitor electrode openings 28 and an isolation structure within trench 30. FIGS. 20 and 21 depict formation of openings 45c. Subsequent processing preferably continues as described above. In this exemplary depicted embodiment, silicon nitride-comprising layer 36a does not cover elevationally outermost surface 43 of conductive material 32 during the etching of material 24.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
    providing a substrate comprising a capacitor array area, a circuitry area other than the capacitor array area, and an intervening area between the capacitor array area and the circuitry area; an insulative material received over the capacitor array area and the circuitry area, the capacitor array area comprising a plurality of capacitor electrode openings within the insulative material received over individual capacitor storage node locations, the intervening area comprising a trench within the insulative material;
    forming conductive material within the capacitor electrode openings and against a sidewall portion of the trench to less than completely fill the trench;
    covering the conductive material received over the sidewall portion of the trench with a silicon nitride-comprising layer which less than fills remaining volume of the trench;
    etching the insulative material within the capacitor array area and the silicon nitride-comprising layer with a liquid etching solution effective to expose outer sidewall portions of the conductive material within the capacitor array area and to expose the conductive material within the trench; and
    incorporating the conductive material within the capacitor array area into a plurality of capacitors.

2. The method of claim 1 wherein the silicon nitride-comprising layer has a thickness no greater than 500 Angstroms.

3. The method of claim 1 wherein the silicon nitride-comprising layer has a thickness no greater than 100 Angstroms.

4. The method of claim 1 wherein the silicon nitride-comprising layer has a thickness no greater than 75 Angstroms.

5. The method of claim 1 wherein the silicon nitride-comprising layer has a thickness of from 20 Angstroms to 60 Angstroms.

6. The method of claim 1 wherein the etching is effective to remove all remaining of the silicon nitride-comprising layer from the trench.

7. The method of claim 1 wherein the conductive material within the trench comprises an opening extending laterally therethrough to the insulative material received over the circuitry area prior to said covering.

8. The method of claim 7 wherein the etching is effective to remove all remaining of the silicon nitride-comprising layer from the trench.

9. The method of claim 7 wherein the covering provides some of the silicon nitride-comprising layer within the laterally extending opening, the etching being ineffective to remove all silicon nitride from within the laterally extending opening.

10. The method of claim 1 wherein the insulative material comprises silicon dioxide comprising at least one of phosphorus and boron, and the liquid etching solution comprises HF.

11. The method of claim 1 wherein the conductive material comprises an elevationally outermost surface, the silicon nitride-comprising layer covering the elevationally outermost surface during said etching.

12. The method of claim 1 wherein the conductive material comprises an elevationally outermost surface, the silicon nitride-comprising layer not covering the elevationally outermost surface during said etching.

13. A method of forming a plurality of capacitors, comprising:
    providing a substrate comprising a capacitor array area, a circuitry area other than the capacitor array area, and an intervening area between the capacitor array area and the circuitry area; an insulative material received over the capacitor array area and the circuitry area, the capacitor array area comprising a plurality of capacitor electrode openings within the insulative material received over individual capacitor storage node locations, the intervening area comprising a trench within the insulative material;
    forming conductive material within the capacitor electrode openings and against a sidewall portion of the trench to less than completely fill the trench, the conductive material within the trench comprising an opening extending laterally therethrough to the insulative material received over the circuitry area;
    covering the conductive material received over the sidewall portion of the trench with a silicon nitride-comprising layer which less than fills remaining volume of the trench;
    etching the insulative material within the capacitor array area and the silicon nitride-comprising layer with a liquid etching solution effective to expose outer sidewall portions of the conductive material within the capacitor array area, to expose the conductive material within the trench, and to expose the insulative material received over the circuitry area through the laterally extending opening in the conductive material; and
    incorporating the conductive material within the capacitor array area into a plurality of capacitors.

14. The method of claim 13 wherein the silicon nitride-comprising layer within the trench is received at least partially within said laterally extending opening.

15. The method of claim 13 wherein the silicon nitride-comprising layer has a thickness no greater than 100 Angstroms.

16. The method of claim 13 wherein the silicon nitride-comprising layer has a thickness no greater than 75 Angstroms.

17. The method of claim 13 wherein the silicon nitride-comprising layer has a thickness of from 20 Angstroms to 60 Angstroms.

18. The method of claim 13 wherein the etching is effective to remove all remaining of the silicon nitride-comprising layer from the trench.

19. The method of claim 13 wherein the insulative material comprises silicon dioxide comprising at least one of phosphorus and boron, and the liquid etching solution comprises HF.

20. The method of claim 13 wherein the conductive material comprises an elevationally outermost surface, the silicon nitride-comprising layer covering the elevationally outermost surface during said etching.

21. The method of claim 13 wherein the conductive material comprises an elevationally outermost surface, the silicon nitride-comprising layer not covering the elevationally outermost surface during said etching.

22. A method of forming a plurality of capacitors, comprising:
   providing a substrate comprising a capacitor array area, a circuitry area other than the capacitor array area, and an intervening area between the capacitor array area and the circuitry area; an insulative material received over the capacitor array area and the circuitry area, the capacitor array area comprising a plurality of capacitor electrode openings within the insulative material received over individual capacitor storage node locations, the intervening area comprising a trench within the insulative material;
   lining sidewall portions of the capacitor electrode openings and the trench with conductive material which less than fills the capacitor electrode openings and the trench;
   covering inner sidewalls of the conductive material within the capacitor electrode openings and within the trench with a silicon nitride-comprising layer which less than fills remaining volume of the capacitor electrode openings and the trench;
   etching the insulative material within the capacitor array area and the silicon nitride-comprising layer with a liquid etching solution effective to expose inner and outer sidewall portions of the conductive material within the capacitor array area and to expose the conductive material within the trench; and
   incorporating the conductive material within the capacitor array area into a plurality of capacitors.

23. A method of forming a plurality of capacitors, comprising:
   providing a substrate comprising a capacitor array area, a peripheral circuitry area other than the capacitor array area, and an intervening area between the capacitor array area and the peripheral circuitry area; an insulative material received over the capacitor array area and the peripheral circuitry area, a first silicon nitride-comprising layer received over the insulative material within the capacitor array area and the peripheral circuitry area, the capacitor array area comprising a plurality of capacitor electrode openings within the first silicon nitride-comprising layer and the insulative material which are received over individual capacitor storage node locations, the first silicon nitride-comprising layer and the intervening area comprising a trench within the insulative material that completely surrounds the capacitor array area;
   lining sidewall portions of the capacitor electrode openings and the trench with conductive material which less than fills the capacitor electrode openings and the trench;
   covering inner sidewalls of the conductive material within the capacitor electrode openings and within the trench with a second silicon nitride-comprising layer which less than fills remaining volume of the capacitor electrode openings and the trench;
   forming etch openings through the first silicon nitride-comprising layer within the capacitor array area effective to expose the insulative material within the capacitor array area while leaving elevationally outermost surfaces of the insulative material within the peripheral circuitry area completely covered with the first silicon nitride-comprising layer;
   etching the second silicon nitride-comprising layer and the insulative material within the capacitor array area through the etch openings with a liquid etching solution effective to expose inner and outer sidewall portions of the conductive material within the capacitor array area and to expose the conductive material within the trench; and
   incorporating the conductive material within the capacitor array area into a plurality of capacitors.

24. A method of forming a plurality of capacitors, comprising:
   providing a substrate comprising a capacitor array area, a peripheral circuitry area other than the capacitor array area, and an intervening area between the capacitor array area and the peripheral circuitry area; an insulative material received over the capacitor array area and the peripheral circuitry area, a masking layer received over the insulative material within the capacitor array area and the peripheral circuitry area, the capacitor array area comprising a plurality of capacitor electrode openings within the masking layer and the insulative material which are received over individual capacitor storage node locations, the masking layer and the intervening area comprising a trench within the insulative material;
   lining sidewall portions of the capacitor electrode openings and the trench with conductive material which less than fills the capacitor electrode openings and the trench;
   covering inner sidewalls of the conductive material within the capacitor electrode openings and within the trench with a silicon nitride-comprising layer which less than fills remaining volume of the capacitor electrode openings and the trench;
   forming etch openings through the masking layer within the capacitor array area effective to expose the insulative material within the capacitor array area while leaving elevationally outermost surfaces of the insulative material within the peripheral circuitry area completely covered with the masking layer;
   etching the silicon nitride-comprising layer and the insulative material within the capacitor array area through the etch openings with a liquid etching solution effective to expose inner and outer sidewall portions of the conductive material within the capacitor array area and to expose the conductive material within the trench; and
   incorporating the conductive material within the capacitor array area into a plurality of capacitors.

25. The method of claim 22 wherein the etching is effective to remove all remaining of the silicon nitride-comprising layer from the capacitor array area.

26. The method of claim 22 wherein the etching is effective to remove all remaining of the silicon nitride-comprising layer from the trench.

27. The method of claim 22 wherein the etching is effective to remove all remaining of the silicon nitride-comprising layer from the capacitor array area and from the trench.

28. The method of claim 22 wherein the silicon nitride-comprising layer has a thickness no greater than 100 Angstroms.

29. The method of claim 22 wherein the silicon nitride-comprising layer has a thickness no greater than 75 Angstroms.

30. The method of claim 22 wherein the silicon nitride-comprising layer has a thickness of from 20 Angstroms to 60 Angstroms.

31. The method of claim 22 wherein the conductive material within the trench comprises an opening extending laterally therethrough to the insulative material received over the circuitry area prior to said covering.

32. The method of claim 31 wherein the etching is effective to remove all remaining of the silicon nitride-comprising layer from the trench.

33. The method of claim 31 wherein the covering provides some of the silicon nitride-comprising layer within the laterally extending opening, the etching being ineffective to remove all silicon nitride from within the laterally extending opening.

34. The method of claim 22 wherein the insulative material comprises silicon dioxide comprising at least one of phosphorus and boron, and the liquid etching solution comprises HF.

35. The method of claim 22 wherein the conductive material comprises an elevationally outermost surface, the silicon nitride-comprising layer covering the elevationally outermost surface during said etching.

36. The method of claim 22 wherein the conductive material comprises an elevationally outermost surface, the silicon nitride-comprising layer not covering the elevationally outermost surface during said etching.

37. The method of claim 23 wherein the second silicon nitride-comprising layer has a thickness no greater than 500 Angstroms.

38. The method of claim 23 wherein the second silicon nitride-comprising layer has a thickness no greater than 100 Angstroms.

39. The method of claim 23 wherein the second silicon nitride-comprising layer has a thickness no greater than 75 Angstroms.

40. The method of claim 23 wherein the second silicon nitride-comprising layer has a thickness of from 20 Angstroms to 60 Angstroms.

41. The method of claim 23 wherein the etching is effective to remove all remaining of the second silicon nitride-comprising layer from the trench.

42. The method of claim 23 wherein the conductive material within the trench comprises an opening extending laterally therethrough to the insulative material received over the circuitry area prior to said covering.

43. The method of claim 42 wherein the etching is effective to remove all remaining of the second silicon nitride-comprising layer from the trench.

44. The method of claim 42 wherein the covering provides some of the second silicon nitride-comprising layer within the laterally extending opening, the etching being ineffective to remove all silicon nitride from within the laterally extending opening.

45. The method of claim 23 wherein the insulative material comprises silicon dioxide comprising at least one of phosphorus and boron, and the liquid etching solution comprises HF.

* * * * *